(12) United States Patent
Weimer et al.

(10) Patent No.: US 11,837,441 B2
(45) Date of Patent: Dec. 5, 2023

(54) DEPOSITING A CARBON HARDMASK BY HIGH POWER PULSED LOW FREQUENCY RF

(71) Applicant: Lam Research Corporation, Fremont, CA (US)

(72) Inventors: Matthew Scott Weimer, Portland, OR (US); Pramod Subramonium, Portland, OR (US); Ragesh Puthenkovilakam, Portland, OR (US); Rujun Bai, Tigard, OR (US); David French, Fort Myers, FL (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/595,505

(22) PCT Filed: May 28, 2020

(86) PCT No.: PCT/US2020/034971
§ 371 (c)(1),
(2) Date: Nov. 18, 2021

(87) PCT Pub. No.: WO2020/243342
PCT Pub. Date: Dec. 3, 2020

(65) Prior Publication Data
US 2022/0216037 A1  Jul. 7, 2022

Related U.S. Application Data

(60) Provisional application No. 62/853,950, filed on May 29, 2019.

(51) Int. Cl.
*H01J 37/32* (2006.01)
*C23C 16/517* (2006.01)
(Continued)

(52) U.S. Cl.
CPC ...... *H01J 37/32146* (2013.01); *C23C 16/517* (2013.01); *C23C 16/52* (2013.01);
(Continued)

(58) Field of Classification Search
CPC ........ C23C 16/517; C23C 16/26; C23C 16/52
See application file for complete search history.

(56) References Cited

U.S. PATENT DOCUMENTS 2,146,448 A   2/1939   Scott et al.
2,405,693 A   8/1946   Hamill et al.
(Continued)

FOREIGN PATENT DOCUMENTS

CN   1877450 A   12/2006
CN   1914715 A   2/2007
(Continued)

OTHER PUBLICATIONS

Callegari et al. (1993) "Optical properties of hydrogenated amorphous-carbon film for attenuated phase-shift mask applications," J.Vac. Sci. Technol. B 11(6):2697-2699.
(Continued)

*Primary Examiner* — Bret P Chen
(74) *Attorney, Agent, or Firm* — Weaver Austin Villeneuve & Sampson LLP

(57) ABSTRACT

Methods and related apparatus for depositing an ashable hard mask (AHM) on a substrate include pulsing a low frequency radio frequency component at a high power. Pulsing low frequency power may be used to increase the selectivity or reduce the stress of an AHM. The AHM may then be used to etch features into underlying layers of the substrate.

25 Claims, 9 Drawing Sheets

(51) Int. Cl.
*C23C 16/52* (2006.01)
*H01L 21/027* (2006.01)
*H01L 21/311* (2006.01)
*H01L 21/3213* (2006.01)

(52) U.S. Cl.
CPC .... *H01J 37/32174* (2013.01); *H01L 21/0272* (2013.01); *H01L 21/31144* (2013.01); *H01L 21/32139* (2013.01); *H01J 2237/3321* (2013.01)

(56) References Cited

U.S. PATENT DOCUMENTS

| | | | |
|---|---|---|---|
| 3,816,976 A | 6/1974 | Stork et al. | |
| 4,209,357 A | 6/1980 | Gorin et al. | |
| 4,274,841 A | 6/1981 | Andresen et al. | |
| 4,668,261 A | 5/1987 | Chatzipetros et al. | |
| 4,673,589 A | 6/1987 | Standley | |
| 4,863,493 A | 9/1989 | Kotani et al. | |
| 4,863,760 A | 9/1989 | Schantz et al. | |
| 4,975,144 A | 12/1990 | Yamazaki et al. | |
| 5,022,959 A | 6/1991 | Itoh et al. | |
| 5,222,549 A | 6/1993 | Ishii et al. | |
| 5,231,057 A | 7/1993 | Doki et al. | |
| 5,261,250 A | 11/1993 | Missimer | |
| 5,378,316 A * | 1/1995 | Franke | H01L 21/3081 |
| | | | 216/2 |
| 5,419,804 A | 5/1995 | Ojha et al. | |
| 5,470,661 A | 11/1995 | Bailey et al. | |
| 5,562,952 A | 10/1996 | Nakahigashi et al. | |
| 5,670,066 A | 9/1997 | Barnes et al. | |
| 5,792,269 A | 8/1998 | Deacon et al. | |
| 5,900,288 A | 5/1999 | Kuhman et al. | |
| 5,948,704 A | 9/1999 | Benjamin et al. | |
| 5,968,379 A | 10/1999 | Zhao et al. | |
| 5,985,103 A | 11/1999 | Givens et al. | |
| 6,006,797 A | 12/1999 | Bulow et al. | |
| 6,030,591 A | 2/2000 | Tom et al. | |
| 6,035,803 A | 3/2000 | Robles et al. | |
| 6,041,734 A | 3/2000 | Raoux et al. | |
| 6,066,209 A | 5/2000 | Sajoto et al. | |
| 6,114,259 A | 9/2000 | Sukharev et al. | |
| 6,150,719 A | 11/2000 | Saia et al. | |
| 6,241,793 B1 | 6/2001 | Lee et al. | |
| 6,286,321 B1 | 9/2001 | Glater | |
| 6,319,299 B1 | 11/2001 | Shih et al. | |
| 6,331,480 B1 | 12/2001 | Tsai et al. | |
| 6,367,413 B1 | 4/2002 | Sill et al. | |
| 6,387,819 B1 | 5/2002 | Yu | |
| 6,422,918 B1 | 7/2002 | Avanzino et al. | |
| 6,458,516 B1 | 10/2002 | Ye et al. | |
| 6,465,051 B1 | 10/2002 | Sahin et al. | |
| 6,478,924 B1 | 11/2002 | Shamouilian et al. | |
| 6,541,397 B1 | 4/2003 | Bencher | |
| 6,573,030 B1 | 6/2003 | Fairbairn et al. | |
| 6,613,434 B1 | 9/2003 | Drevillon et al. | |
| 6,617,553 B2 | 9/2003 | Ho et al. | |
| 6,635,185 B2 | 10/2003 | Demmin et al. | |
| 6,777,349 B2 | 8/2004 | Fu et al. | |
| 6,787,452 B2 | 9/2004 | Sudijono et al. | |
| 6,787,819 B2 | 9/2004 | Rhodes et al. | |
| 6,884,733 B1 | 4/2005 | Dakshina-Murthy et al. | |
| 6,967,072 B2 | 11/2005 | Latchford et al. | |
| 6,984,591 B1 | 1/2006 | Buchanan et al. | |
| 7,063,742 B1 | 6/2006 | Ando et al. | |
| 7,064,078 B2 | 6/2006 | Liu et al. | |
| 7,202,176 B1 | 4/2007 | Goto et al. | |
| 7,205,228 B2 | 4/2007 | Padhi et al. | |
| 7,220,982 B2 | 5/2007 | Campbell | |
| 7,223,526 B2 | 5/2007 | Fairbairn et al. | |
| 7,235,478 B2 | 6/2007 | Geng et al. | |
| 7,271,106 B2 | 9/2007 | Abatchev et al. | |
| 7,288,484 B1 | 10/2007 | Goto et al. | |
| 7,314,506 B2 | 1/2008 | Vininski et al. | |
| 7,323,401 B2 | 1/2008 | Ramaswamy et al. | |
| 7,381,644 B1 | 6/2008 | Subramonium et al. | |
| 7,399,712 B1 | 7/2008 | Graff | |
| 7,407,893 B2 | 8/2008 | Seamons et al. | |
| 7,495,984 B2 | 2/2009 | Kim et al. | |
| 7,576,009 B2 | 8/2009 | Lee et al. | |
| 7,637,269 B1 | 12/2009 | Zin et al. | |
| 7,732,728 B2 | 6/2010 | Dhindsa et al. | |
| 7,740,736 B2 | 6/2010 | Fischer et al. | |
| 7,803,715 B1 | 9/2010 | Haimson et al. | |
| 7,820,556 B2 | 10/2010 | Hsu et al. | |
| 7,915,166 B1 | 3/2011 | Yu et al. | |
| 7,955,990 B2 | 6/2011 | Henri et al. | |
| 7,981,777 B1 * | 7/2011 | Subramonium | C23C 16/509 |
| | | | 438/485 |
| 7,981,810 B1 * | 7/2011 | Subramonium | H01L 21/31144 |
| | | | 257/E21.264 |
| 8,110,493 B1 * | 2/2012 | Subramonium | H01L 21/02115 |
| | | | 438/618 |
| 8,114,782 B2 | 2/2012 | Graff | |
| 8,129,281 B1 | 3/2012 | Cheung et al. | |
| 8,227,352 B2 | 7/2012 | Yu et al. | |
| 8,309,473 B2 | 11/2012 | Hsu et al. | |
| 8,361,906 B2 * | 1/2013 | Lee | C23C 16/26 |
| | | | 430/313 |
| 8,435,608 B1 * | 5/2013 | Subramonium | H01L 21/0332 |
| | | | 427/569 |
| 8,563,414 B1 | 10/2013 | Fox et al. | |
| 8,569,179 B2 | 10/2013 | Graff | |
| 8,664,124 B2 * | 3/2014 | Graff | H01L 21/31144 |
| | | | 438/720 |
| 8,669,181 B1 | 3/2014 | Yu et al. | |
| 8,962,101 B2 | 2/2015 | Subramonium et al. | |
| 9,240,320 B1 * | 1/2016 | Subramonium | H01L 21/02115 |
| 9,304,396 B2 | 4/2016 | Shamma et al. | |
| 9,320,387 B2 | 4/2016 | Reddy et al. | |
| 9,543,148 B1 * | 1/2017 | Hudson | H01L 21/67069 |
| 9,589,799 B2 * | 3/2017 | Reddy | H01L 21/0332 |
| 9,618,846 B2 | 4/2017 | Shamma et al. | |
| 2001/0021491 A1 | 9/2001 | Chen et al. | |
| 2002/0182848 A1 | 12/2002 | Joseph et al. | |
| 2002/0185151 A1 | 12/2002 | Qingyuan et al. | |
| 2003/0044532 A1 | 3/2003 | Lee et al. | |
| 2003/0106647 A1 | 6/2003 | Koshiishi et al. | |
| 2003/0119307 A1 | 6/2003 | Bekiaris et al. | |
| 2003/0124859 A1 | 7/2003 | Cheung et al. | |
| 2004/0000534 A1 | 1/2004 | Lipinski | |
| 2004/0016972 A1 | 1/2004 | Singh et al. | |
| 2004/0018750 A1 | 1/2004 | Sophie et al. | |
| 2004/0023502 A1 | 2/2004 | Tzou et al. | |
| 2004/0058517 A1 | 3/2004 | Nallan et al. | |
| 2004/0140506 A1 | 7/2004 | Singh et al. | |
| 2004/0180551 A1 | 9/2004 | Biles et al. | |
| 2004/0224504 A1 | 11/2004 | Gadgil | |
| 2004/0266195 A1 | 12/2004 | Dokumaci et al. | |
| 2005/0042889 A1 | 2/2005 | Lee et al. | |
| 2005/0054202 A1 | 3/2005 | Pan et al. | |
| 2005/0098119 A1 | 5/2005 | Burger et al. | |
| 2005/0112506 A1 | 5/2005 | Czech et al. | |
| 2005/0129935 A1 | 6/2005 | Kunitake et al. | |
| 2005/0130404 A1 | 6/2005 | Moghadam et al. | |
| 2005/0167394 A1 | 8/2005 | Liu et al. | |
| 2005/0202683 A1 | 9/2005 | Wang et al. | |
| 2005/0260411 A1 | 11/2005 | Ravi | |
| 2005/0287771 A1 | 12/2005 | Seamons et al. | |
| 2006/0019486 A1 | 1/2006 | Yu et al. | |
| 2006/0024945 A1 | 2/2006 | Kim et al. | |
| 2006/0046483 A1 | 3/2006 | Abatchev et al. | |
| 2006/0091559 A1 | 5/2006 | Nguyen et al. | |
| 2006/0105577 A1 | 5/2006 | Donohoe et al. | |
| 2006/0154086 A1 | 7/2006 | Fuller et al. | |
| 2006/0154477 A1 | 7/2006 | Geng et al. | |
| 2006/0197881 A1 | 9/2006 | Kang et al. | |
| 2006/0205223 A1 | 9/2006 | Smayling | |
| 2006/0231524 A1 | 10/2006 | Liu et al. | |
| 2006/0246373 A1 | 11/2006 | Wang | |
| 2007/0032054 A1 | 2/2007 | Ramaswamy et al. | |
| 2007/0048674 A1 | 3/2007 | Wells | |
| 2007/0054500 A1 | 3/2007 | Bencher | |
| 2007/0059913 A1 | 3/2007 | King et al. | |

(56) References Cited

U.S. PATENT DOCUMENTS

| | | |
|---|---|---|
| 2007/0072112 A1 | 3/2007 | Prokopowicz et al. |
| 2007/0077780 A1 | 4/2007 | Wang et al. |
| 2007/0087520 A1 | 4/2007 | Mitsuiki et al. |
| 2007/0105303 A1 | 5/2007 | Busch et al. |
| 2007/0125762 A1 | 6/2007 | Cui et al. |
| 2007/0128538 A1 | 6/2007 | Fairbairn et al. |
| 2007/0134917 A1 | 6/2007 | Li et al. |
| 2007/0140029 A1 | 6/2007 | Kim et al. |
| 2007/0166546 A1 | 7/2007 | Ichikawa et al. |
| 2007/0166979 A1 | 7/2007 | Wang et al. |
| 2007/0202640 A1 | 8/2007 | Al-Bayati et al. |
| 2007/0245960 A1 | 10/2007 | Paterson et al. |
| 2007/0247073 A1* | 10/2007 | Paterson et al. |
| 2007/0249172 A1 | 10/2007 | Huang et al. |
| 2008/0073636 A1 | 3/2008 | Kim |
| 2008/0083916 A1 | 4/2008 | Kim |
| 2008/0128907 A1 | 6/2008 | Yang et al. |
| 2008/0200003 A1 | 8/2008 | Hong et al. |
| 2008/0211118 A1 | 9/2008 | Wyse et al. |
| 2008/0242912 A1 | 10/2008 | Letessier et al. |
| 2008/0254639 A1 | 10/2008 | Graff |
| 2008/0254641 A1 | 10/2008 | Kobayashi et al. |
| 2008/0264803 A1 | 10/2008 | Agrawal |
| 2009/0176174 A1 | 7/2009 | Chen et al. |
| 2009/0182180 A1 | 7/2009 | Huang et al. |
| 2009/0286402 A1 | 11/2009 | Xia et al. |
| 2009/0294062 A1 | 12/2009 | Shannon et al. |
| 2009/0305516 A1 | 12/2009 | Hsu et al. |
| 2010/0032838 A1 | 2/2010 | Kikuchi et al. |
| 2010/0151691 A1 | 6/2010 | Henri et al. |
| 2010/0197558 A1 | 8/2010 | Miralles et al. |
| 2010/0297853 A1 | 11/2010 | Hsu et al. |
| 2011/0236594 A1 | 9/2011 | Haverkamp et al. |
| 2011/0236600 A1 | 9/2011 | Fox et al. |
| 2011/0244142 A1 | 10/2011 | Cheng et al. |
| 2011/0287633 A1 | 11/2011 | Lee et al. |
| 2012/0121764 A1 | 5/2012 | Lai et al. |
| 2012/0149207 A1 | 6/2012 | Graff |
| 2012/0164836 A1 | 6/2012 | Chumakov |
| 2012/0196446 A1 | 8/2012 | Graff |
| 2013/0109188 A1 | 5/2013 | Kim et al. |
| 2013/0216956 A1 | 8/2013 | Kishioka et al. |
| 2013/0333616 A1 | 12/2013 | Klindworth et al. |
| 2014/0057454 A1 | 2/2014 | Subramonium et al. |
| 2014/0113457 A1* | 4/2014 | Sims ................. H01L 21/02167 |
| | | 438/778 |
| 2014/0199628 A1 | 7/2014 | Edelstein et al. |
| 2014/0239462 A1 | 8/2014 | Shamma et al. |
| 2014/0273469 A1 | 9/2014 | Wahl et al. |
| 2014/0273473 A1 | 9/2014 | Schmid et al. |
| 2015/0093908 A1* | 4/2015 | Reddy .................... C23C 16/505 |
| | | 438/758 |
| 2015/0093915 A1 | 4/2015 | Reddy et al. |
| 2015/0287612 A1 | 10/2015 | Luere et al. |
| 2016/0179005 A1 | 6/2016 | Shamma et al. |
| 2016/0225632 A1 | 8/2016 | Shaikh et al. |
| 2016/0281230 A1 | 9/2016 | Varadarajan et al. |
| 2016/0314960 A1* | 10/2016 | Cheng ............... H01L 21/02274 |
| 2016/0343580 A1* | 11/2016 | Hudson ............. H01L 21/67069 |
| 2017/0178920 A1* | 6/2017 | Dole ................. H01J 37/32137 |
| 2018/0068852 A1 | 3/2018 | Cottle et al. |
| 2018/0286707 A1* | 10/2018 | Hudson ............... H01J 37/3244 |
| 2018/0358220 A1 | 12/2018 | Yu et al. |
| 2018/0358222 A1 | 12/2018 | Venkatasubramanian et al. |
| 2022/0181147 A1* | 6/2022 | Xue ................. H01J 37/32816 |
| 2022/0282366 A1 | 9/2022 | Weimer et al. |
| 2023/0167545 A1 | 6/2023 | Reddy et al. |

FOREIGN PATENT DOCUMENTS

| | | |
|---|---|---|
| CN | 1953146 A | 4/2007 |
| CN | 102001616 A | 4/2011 |
| CN | 102790127 A | 11/2012 |
| EP | 1720072 A1 | 11/2006 |
| FR | 2853313 A1 | 10/2004 |
| JP | S62019539 A | 1/1987 |
| JP | H08152262 A | 6/1996 |
| JP | 2000026194 A | 1/2000 |
| JP | 2001148382 A | 5/2001 |
| JP | 2002212740 A | 7/2002 |
| JP | 2004238649 A | 8/2004 |
| JP | 2005187318 A | 7/2005 |
| JP | 2005240061 A | 9/2005 |
| JP | 2005354109 A | 12/2005 |
| JP | 2008141009 A | 6/2008 |
| JP | 2008291344 A | 12/2008 |
| JP | 2009226277 A | 10/2009 |
| JP | 2011085670 A | 4/2011 |
| JP | 2012233259 A | 11/2012 |
| JP | 2013526061 A | 6/2013 |
| JP | 2013526783 A | 6/2013 |
| KR | 20030051692 A | 6/2003 |
| KR | 20040023557 A | 3/2004 |
| KR | 20060010932 A | 2/2006 |
| KR | 20060053855 A | 5/2006 |
| KR | 20070015031 A | 2/2007 |
| KR | 100986503 B1 | 10/2010 |
| KR | 20110065469 A | 6/2011 |
| KR | 20130086525 A | 8/2013 |
| KR | 20140068055 A | 6/2014 |
| KR | 20150103642 A | 9/2015 |
| KR | 20200140388 A | 12/2020 |
| SU | 382671 A | 10/1973 |
| TW | 200723447 A | 6/2007 |
| TW | 200937517 A | 9/2009 |
| TW | 201133618 A | 10/2011 |
| WO | WO-2005048367 A1 | 5/2005 |
| WO | WO-2011146212 A2 | 11/2011 |
| WO | WO-2012050065 A1 | 4/2012 |
| WO | WO-2013182299 A1 | 12/2013 |
| WO | WO-2020243342 A1 | 12/2020 |

OTHER PUBLICATIONS

Chinese First Office Action, dated Aug. 1, 2016, issued in Application No. CN 201410513782.9.

Chinese First Office Action, dated Aug. 16, 2016, issued in Application No. CN 201310049856.3.

Chinese First Office Action dated Nov. 22, 2019 issued in Application No. CN 201810585572.9.

Chinese First Office Action, dated Oct. 9, 2016, issued in Application No. Cn 201410513389.X.

Chinese Second Office Action, dated Feb. 24, 2017, issued in Application No. CN 201310049856.3.

Chinese Second Office Action dated Mar. 28, 2017 issued in Application No. CN 201410513782.9.

Chinese Second Office Action dated Oct. 28, 2020 issued in Application No. CN 201810585572.9.

Chinese Third Office Action dated Mar. 22, 2021 issued in Application No. CN 201810585572.9.

Chinese Third Office Action dated Sep. 19, 2017 issued in Application No. CN 201410513782.9.

Decision to Grant a Patent dated Mar. 10, 2020 issued in JP 2014-193209.

FABTECH news release: "New Product: Ashable hard mask process from Novellus targets high aspect ratio etch," (Jun. 28, 2007), 2 pages.

Grill, A. (1999) "Diamond-like carbon: state of the art," Diamond and Related Materials 8,pp. 428-434.

Grill, A. (1999) "Plasma-deposited diamondlike carbon and related materials," IBM Journal of Research and Development, vol. 43, 1/2, http://research.IBM.com/journal/rd/431/grill.html., 14 pp.

Grill, et al. (1990) "Diamondlike carbon films by rf plasma-assisted chemical vapor deposition from acetylene," IBM J. Res. Develop., 34(6):849-857.

Holmes et al. (1987) "Trimethylsilylacetylene", Organic Syntheses, Coll. Vol. 8, p. 606; vol. 65, p. 61.

Ikeda et al. (1992) "Top-PECVD": A New Conformal Plasma Enhanced CVD Technology using TEOS, Ozone and Pulse-modulated RF Plasma, IEEE, pp. 11.2.1-11.2.4.

(56) References Cited

OTHER PUBLICATIONS

International Preliminary Report on Patentability dated Dec. 9, 2021, for International Application No. PCT/US2020/034971.
International Preliminary Report on Patentability dated Mar. 10, 2022, in Application No. PCT/US2020/048551.
International Search Report and Written Opinion dated Dec. 4, 2020 issued in PCT/US2020/048551.
International Search Report and Written Opinion dated Sep. 18, 2020 issued in PCT/US2020/034971.
Jacobsohn et al. (1998) "Hydrogenated Carbon-Nitrogen Films Obtained by PECVD Using Acetylyne and Nitrogen As Precursor Gases," Mat. Res. Soc. Symp. Proc., 498: 283-288.
Japanese First Office Action dated Jul. 6, 2018 issued in Application No. JP 2014-193560.
Japanese First Office Action dated Jun. 27, 2018 issued in JP 2014-193209.
Japanese First Office Action dated Mar. 24, 2020 issued in Application No. JP 2019-005610.
Japanese Second Office Action dated Mar. 15, 2021 issued in Application No. JP 2019-005610.
Japanese Second Office Action dated May 27, 2019 issued in JP 2014-193209.
Korean First Office Action dated Apr. 19, 2021 issued in KR 10-2014-0130456.
Korean First Office Action dated Apr. 20, 2021 issued in Application No. KR 10-2014-0130444.
Korean First Office Action, dated Aug. 27, 2019, issued in Application No. KR 10-2013-0015077.
Korean First Office Action dated Jul. 29, 2021 issued in KR 10-2021-0054382.
Korean First Office Action dated Jun. 28, 2020 issued in KR 10-2014-0022022.
Korean Office Action, dated Jun. 1, 2010, issued in Application No. KR 2009/0048358.
Korean Office Action, dated Sep. 15, 2015, issued in Application No. KR 10-2009-0123999.
Korean Second Office Action dated Sep. 10, 2021 issued in KR 10-2014-0130456.
Korean Second Office Action dated Sep. 8, 2021 issued in Application No. KR 10-2014-0130444.
KR Office Action dated Dec. 14, 2021, in Application No. KR1020140130456 with English translation.
KR Office Action dated Jan. 24, 2022, in Application No. KR1020210054382 with English translation.
Kragler et al. (1995) "Scanning tunneling microscopy based lithography employing amorphous hydrogenated carbon as a high resolution resist mask," Appl. Phys. Lett. 67(8):1163-1165.
Kreupl, Franz et al. (2008) "Carbon-Based Resistive Memory," presented at IEDM, submitted Jun. 26, 2008; accepted Aug. 4, 2008, 4 pages.
Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, Mat. Res. Soc. Symp. Proc. Vol 172, 12 pages, @ 1990 Materials Research Society.
Matheson brochure: "PICO-TRAP™ AHM: Ultra-Purification System for PECVD of Amorphous Carbon Films," (Apr. 2010), Matheson, 2pp.
Muhl et al. (1999) "A Review of the Preparation of Carbon Nitride Films," Diamond and Related Materials, 8:1809-1830.
Ong, Soon-Eng et al. (2007) "Temperature effect on bonding structures of amorphous carbon containing more than 30at.% silicon," Diamond & Related Materials, 16:1823-1827.
Singapore Examination Report dated Jun. 22, 2016 issued in Application No. SG 201300974-1.
Singapore Search Report and Written Opinion dated Dec. 15, 2015 issued in Application No. SG 201300974-1.
Subramonium et al., "Low Temperature Ashable Hardmask (AHMTM) Films for sub-45nm Patterning," citation information unavailable, No. date available, 3pp.
Taiwan Examination and Search Report, dated Oct. 4, 2016, issued in Application No. TW 102104640.
Taiwan Office Action, dated May 8, 2014, issued in Application No. TW 098142631.
Taiwanese First Office Action dated Apr. 9, 2018 issued in TW 103133764.
Taiwanese Notice of Allowance dated Apr. 26, 2017 issued in TW 103106336.
U.S. Final Office Action, dated Apr. 12, 2011, issued in U.S. Appl. No. 11/849,208.
U.S. Final Office Action dated Apr. 15, 2010 issued in U.S. Appl. No. 11/710,652.
U.S. Final Office Action, dated Apr. 24, 2013, issued in U.S. Appl. No. 11/849,208.
U.S. Final Office Action, dated Apr. 19, 2012, issued in U.S. Appl. No. 12/786,842.
U.S. Final Office Action, dated Aug. 4, 2014, issued in U.S. Appl. No. 13/974,808.
U.S. Final Office Action, dated Dec. 21, 2009, issued in U.S. Appl. No. 12/133,223.
U.S. Final Office Action, dated Dec. 30, 2010, issued in U.S. Appl. No. 11/449,983.
U.S. Final Office Action, dated Dec. 9, 2009, issued in U.S. Appl. No. 11/612,382.
U.S. Final Office Action, dated Feb. 24, 2009, issued in U.S. Appl. No. 11/612,382.
U.S. Final Office Action, dated Jul. 22, 2016, issued in U.S. Appl. No. 14/248,046.
U.S. Final Office Action, dated Jul. 9, 2008, issued in U.S. Appl. No. 11/449,983.
U.S. Final Office Action, dated Mar. 14, 2013, issued in U.S. Appl. No. 12/766,721.
U.S. Final Office Action, dated May 12, 2009, issued in U.S. Appl. No. 11/612,382.
U.S. Final Office Action, dated May 13, 2008, issued in U.S. Appl. No. 11/612,382.
U.S. Final Office Action dated Oct. 18, 2012, issued in U.S. Appl. No. 12/163,670.
U.S. Final Office Action, dated Oct. 24, 2007, issued in U.S. Appl. No. 11/263,148.
U.S. Final Office Action, dated Oct. 9, 2015, issued in U.S. Appl. No. 14/270,001.
U.S. Final Office Action, dated Sep. 14, 2012, issued in U.S. Appl. No. 11/849,208.
U.S. Final Office Action, dated Sep. 15, 2009, issued in U.S. Appl. No. 11/449,983.
U.S. Notice of Allowance and Allowed Claims dated Nov. 24, 2010 issued in U.S. Appl. No. 11/710,652.
U.S. Notice of Allowance, dated Dec. 23, 2015, issued in U.S. Appl. No. 14/270,001.
U.S. Notice of Allowance, dated Dec. 30, 2013, issued in U.S. Appl. No. 13/372,363.
U.S. Notice of Allowance, dated Dec. 6, 2016, issued in U.S. Appl. No. 15/053,987.
U.S. Notice of Allowance dated Jan. 3, 2013, issued in U.S. Appl. No. 12/163,670.
U.S. Notice of Allowance, dated Jan. 7, 2008, issued in U.S. Appl. No. 11/318,269.
U.S. Notice of Allowance, dated Jul. 1, 2013, issued in U.S. Appl. No. 13/371,184.
U.S. Notice of Allowance, dated Jul. 20, 2012, issued in U.S. Appl. No. 12/786,842.
U.S. Notice of Allowance, dated Jun. 28, 2013, issued in U.S. Appl. No. 12/766,721.
U.S. Notice of Allowance, dated Mar. 16, 2011, issued in U.S. Appl. No. 11/449,983.
U.S. Notice of Allowance, dated Mar. 18, 2008, issued in U.S. Appl. No. 11/263,148.
U.S. Notice of Allowance, dated Mar. 2, 2010, issued in U.S. Appl. No. 12/133,223.
U.S. Notice of Allowance, dated Mar. 22, 2011, issued in U.S. Appl. No. 11/710,377.

(56) References Cited

OTHER PUBLICATIONS

U.S. Notice of Allowance, dated May 7, 2007, issued in U.S. Appl. No. 11/318,269.
U.S. Notice of Allowance, dated Nov. 2, 2010, issued in U.S. Appl. No. 12/334,220.
U.S. Notice of Allowance, dated Nov. 25, 2015, issued in U.S. Appl. No. 14/185,757.
U.S. Notice of Allowance, dated Oct. 13, 2011, issued in U.S. Appl. No. 12/142,226.
U.S. Notice of Allowance, dated Oct. 23, 2014, issued in U.S. Appl. No. 13/974,808.
U.S. Notice of Allowance dated Oct. 25, 2013 issued in U.S. Appl. No. 13/032,392.
U.S. Notice of Allowance, dated Oct. 31, 2016, issued in U.S. Appl. No. 14/248,046.
U.S. Notice of Allowance, dated Oct. 4, 2006, issued in U.S. Appl. No. 11/318,269.
U.S. Notice of Allowance, dated Oct. 7, 2011, issued in U.S. Appl. No. 12/048,967.
U.S. Notice of Allowance dated Sep. 22, 2015, issued in U.S. Appl. No. 13/856,364.
U.S. Office Action, dated Apr. 18, 2011, issued in U.S. Appl. No. 12/048,967.
U.S. Office Action, dated Aug. 10, 2012, issued in U.S. Appl. No. 12/766,721.
U.S. Office Action, dated Aug. 12, 2016, issued in U.S. Appl. No. 15/053,987.
U.S. Office Action, dated Aug. 19, 2008, issued in U.S. Appl. No. 11/612,382.
U.S. Office Action, dated Aug. 19, 2009, issued in U.S. Appl. No. 11/710,377.
U.S. Office Action, dated Aug. 19, 2009, issued in U.S. Appl. No. 12/133,223.
U.S. Office Action, dated Aug. 27, 2007, issued in U.S. Appl. No. 11/318,269.
U.S. Office Action dated Aug. 5, 2010 issued in U.S. Appl. No. 11/710,652.
U.S. Office Action, dated Aug. 6, 2015, issued in U.S. Appl. No. 14/185,757.
U.S. Office Action, dated Dec. 14, 2006, issued in U.S. Appl. No. 11/318,269.
U.S. Office Action dated, Dec. 27, 2007, issued in U.S. Appl. No. 11/449,983.
U.S. Office Action, dated Feb. 14, 2012, issued in U.S. Appl. No. 12/163,670.
U.S. Office Action, dated Feb. 15, 2013, issued in U.S. Appl. No. 13/371,184.
U.S. Office Action, dated Feb. 28, 2014, issued in U.S. Appl. No. 13/974,808.
U.S. Office Action, dated Jan. 14, 2016, issued in U.S. Appl. No. 14/248,046.
U.S. Office Action, dated Jan. 5, 2009, issued in U.S. Appl. No. 11/449,983.
U.S. Office Action, dated Jan. 5, 2009, issued in U.S. Appl. No. 11/710,377.
U.S. Office Action, dated Jul. 6, 2012, issued in U.S. Appl. No. 12/163,670.
U.S. Office Action dated Jul. 9, 2013 issued in U.S. Appl. No. 13/032,392.
U.S. Office Action, dated Jun. 1, 2007, issued in U.S. Appl. No. 11/263,148.
U.S. Office Action, dated Jun. 1, 2007, issued in U.S. Appl. No. 11/612,382.
U.S. Office Action, dated Jun. 21, 2010, issued in U.S. Appl. No. 11/449,983.
U.S. Office Action, dated Mar. 26, 2010, issued in U.S. Appl. No. 11/612,382.
U.S. Office Action, dated Mar. 31, 2010, issued in U.S. Appl. No. 11/710,377.
U.S. Office Action, dated May 15, 2015, issued in U.S. Appl. No. 14/270,001.
U.S. Office Action, dated May 2, 2011, issued in U.S. Appl. No. 12/142,226.
U.S. Office Action dated Nov. 20, 2009 issued in U.S. Appl. No. 11/710,652.
U.S. Office Action, dated Nov. 22, 2010, issued in U.S. Appl. No. 12/048,967.
U.S. Office Action, dated Nov. 9, 2011, issued in U.S. Appl. No. 12/786,842.
U.S. Office Action, dated Oct. 19, 2011, issued in U.S. Appl. No. 12/163,670.
U.S. Office Action, dated Oct. 9, 2007, issued in U.S. Appl. No. 11/612,382.
U.S. Office Action, dated Oct. 9, 2013, issued in U.S. Appl. No. 13/372,363.
U.S. Office Action, dated Sep. 3, 2010, issued in U.S. Appl. No. 11/849,208.
U.S. Appl. No. 11/710,652, filed Feb. 22, 2007, entitled "Improved Duffusion Barrier and Etch Stop Films" Superseded by U.S. Pat. No. 7,915,166.
U.S. Appl. No. 12/133,223, filed Jun. 4, 2008, entitled "Method for Purifying Acetylene Gas for Use In Semiconductor Processes" Superseded by U.S. Pat. No. 7,820,556.
U.S. Appl. No. 12/786,842, filed May 25, 2010, entitled "Method for Purifying Acetylene Gas For Use in Semiconductor Processes" Superseded by U.S. Pat. No. 8,309,473.
U.S. Appl. No. 13/371,184, filed Feb. 10, 2012, entitled "Method for Etching Organic Hardmasks" 2012/0149207, now U.S. Pat. No. 8,569,179.
U.S. Appl. No. 13/372,363, filed Feb. 13, 2012, entitled "Method for Etching Organic Hardmasks" Now. 2012/0196446.
U.S. Appl. No. 15/053,987, filed Feb. 25, 2016, entitled "PECVD Films for EUV Lithography." [2016/0179005].
U.S. Appl. No. 11/449,983, filed Jun. 8, 2006, entitled "Methods of Depositing Highly Selective Transparent Ashable Hardmask Films." Superseded by U.S. Pat. No. 7,981,810.
U.S. Appl. No. 11/612,382, filed Dec. 18, 2006, entitled "Methods of Improving Ashable Hardmask Adhesion to Metal layers.".
U.S. Appl. No. 11/710,377, filed Feb. 22, 2007, entitled "Methods of Depositing Stable and Hermetic Ashable Hardmask Films," pp. 1-26. Superseded by U.S. Pat. No. 7,981,777.
U.S. Appl. No. 11/849,208, filed Aug. 31, 2007, entitled "Methods and Apparatus for Plasma-Based Deposition.".
U.S. Appl. No. 12/048,967, filed Mar. 14, 2008, entitled "Pulsed PECVD Method for Modulating Hydrogen Content in Hard Mask." Superseded by U.S. Pat. No. 8,110,493.
U.S. Appl. No. 12/163,670, filed Jun. 27, 2008, entitled "Methods of Depositing Smooth and Conformal Ashable Hard Mask Films" Superseded by U.S. Pat. No. 8,435,608.
U.S. Appl. No. 12/334,220, filed Dec. 12, 2008, entitled "Method for Improved Thickness Repeatability of PECVD Deposited Carbon Films." [see US Patent Publication No. 2010/0151691] Superseded by U.S. Pat. No. 7,955,990.
U.S. Appl. No. 12/766,721, filed Apr. 23, 2010, entitled "Methods For Forming Conductive Carbon Films By PECVD" Superseded by U.S. Pat. No. 8,563,414.
U.S. Appl. No. 13/032,392, filed Feb. 22, 2011, entitled "Improved Diffusion Barrier and Etch Stop Films" Superseded by U.S. Pat. No. 8,669,181.
U.S. Appl. No. 13/160,399, filed Jun. 14, 2011, entitled "Methods of Depositing Highly Selective Transparent Ashable Hardmask Films.".
U.S. Appl. No. 13/856,364, filed Apr. 3, 2013, entitled "Methods of Depositing Smooth and Conformal Ashable Hard Mask Films" Now U.S. Pat. No. 9,240,320.
U.S. Appl. No. 13/974,808, filed Aug. 23, 2013, entitled "Methods and Apparatus for Plasma-Based Deposition" Now 2014/0057454; U.S. Pat. No. 8,962,101.
U.S. Appl. No. 14/185,757, filed Feb. 20, 2014, entitled "PECVD Films for EUV Lithography." [2014/0239462] [U.S. Pat. No. 9,304,396].

(56) References Cited

OTHER PUBLICATIONS

U.S. Appl. No. 14/248,046, filed Apr. 8, 2014, entitled High Selectivity and Low Stress Carbon Hardmask By Pulsed Low Frequency RF Power. Now 2015/0093908.
U.S. Appl. No. 14/270,001, filed May 5, 2014, entitled "Sulfur Doped Carbon Hard Masks." [2015/0093915] [U.S. Pat. No. 9,320,387].
U.S. Supplemental Notice of Allowance, dated Feb. 8, 2011, issued in U.S. Appl. No. 12/334,220.
Van de Ven et al. (1990) "Advantages of Dual Frequency PECVD for Deposition of ILD and Passivation Films," VLSI Multilevel Interconnection Conference Proceedings, Seventh International IEEE, 194-201.
Voronkin et al. (1994) "Structure and mechanical properties of a-C:H films deposited onto polymer substrates: Diamond and Related Materials," 4:5-9.
International Search Report and Written Opinion dated Jan. 10, 2022, in Application No. PCT/US2021/051776.
International Search Report and Written Opinion dated Jul. 7, 2021 in PCT Application No. PCT/US2021/022162.
International Preliminary Report on Patentability dated Apr. 6, 2023 in Application No. PCT/US2021/051776.
International Preliminary Report on Patentability dated Sep. 22, 2022, in PCT Application No. PCT/US2021/022162.
KR Office Action dated Dec. 9, 2022, in Application No. KR10-2022-0119327 with English translation.
KR Office Action dated Dec. 14, 2022 in Application No. KR10-2022-0049352 With English Translation.
KR Office Action dated Jul. 13, 2022 in Application No. KR10-2022-0031478 with English translation.
KR Office Action dated Jun. 21, 2022, in Application No. KR10-2014-0130444 with English translation.
U.S. Appl. No. 17/905,955, inventors Reddy et al., filed Sep. 9, 2022.
U.S. Appl. No. 18/245,950, inventors Weimer et al., filed Mar. 20, 2023.
International Preliminary Report on Patentability dated Jun. 29, 2023, in Application No. PCT/US2021/063109.
International Search Report and Written Opinion dated Apr. 14, 2022, for International Application No. PCT/US2021/063109.
U.S. Appl. No. 18/256,893, inventors Antony et al., filed Jun. 9, 2023.

* cited by examiner

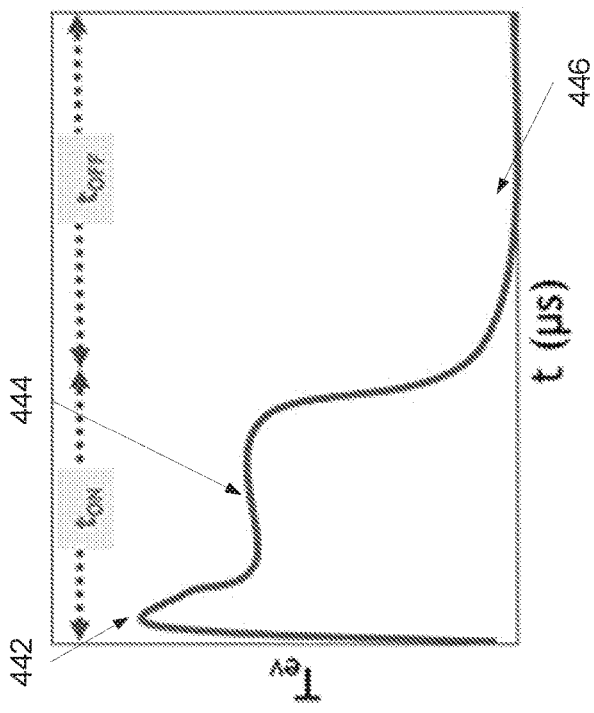
FIG. 4A
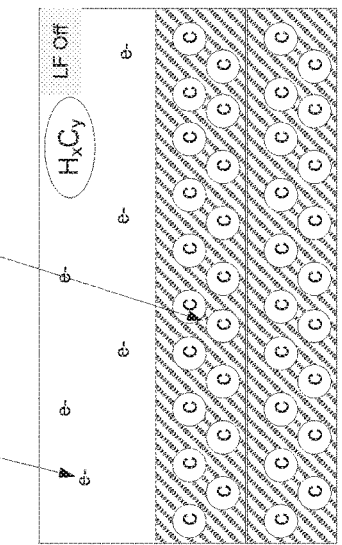
FIG. 4C
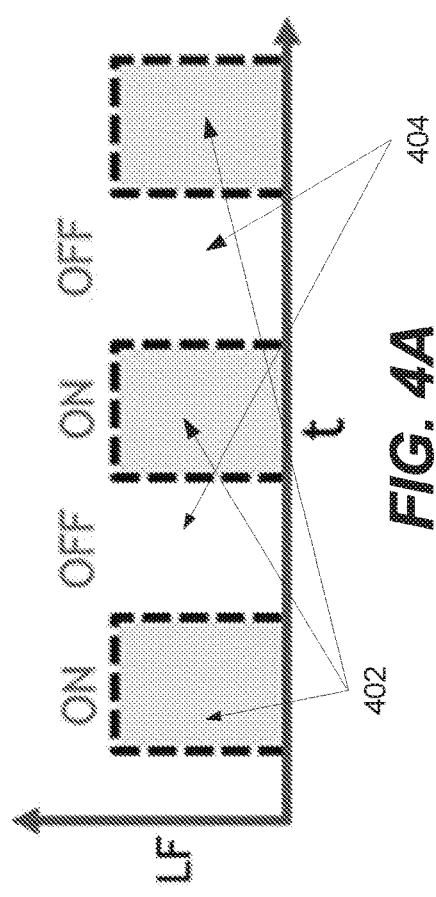
FIG. 4B
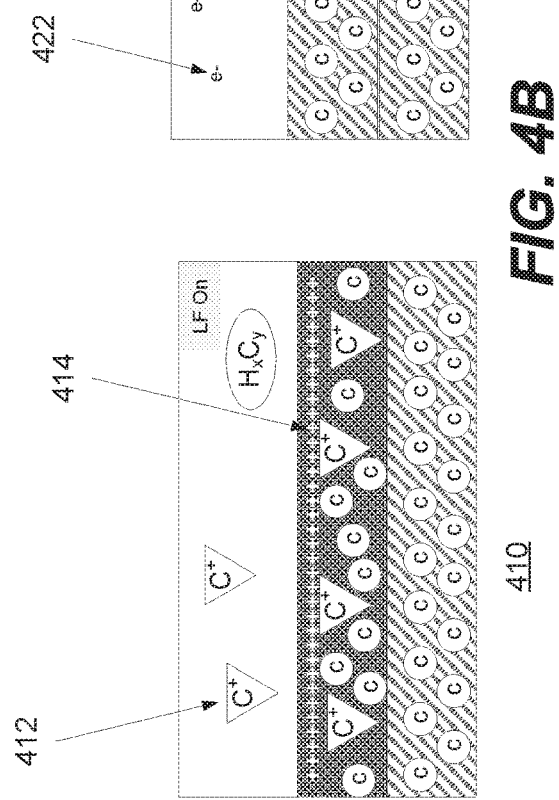

DEPOSITING A CARBON HARDMASK BY HIGH POWER PULSED LOW FREQUENCY RF

INCORPORATED BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Amorphous carbon films may be used as hard masks and etch stop layers in semiconductor processing, including in memory and logic device fabrication. These films are also known as ashable hard masks (AHMs) because they may be removed by an ashing technique. As aspect ratios in lithography increase, AHMs require higher etch selectivity. Current methods of forming highly selective AHMs using plasma enhanced chemical vapor deposition (PECVD) processes result in AHMs with high stress, limiting the AHMs' usefulness as hard masks. Accordingly, it is desirable to produce AHMs having high etch selectivity, but low stress.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Disclosed herein are methods and systems of depositing an ashable hard mask (AHM) film by plasma enhanced chemical vapor deposition (PECVD) that decreases stress levels and increases etch selectivity. In various embodiments, the methods can involve exposing a substrate to a process gas including a hydrocarbon precursor, and generating a plasma using a dual radio frequency (RF) source by pulsing low frequency (LF) power. Pulsing the LF power at a high power, high frequency, and low duty cycle (DC) may increase the modulus, and thus the selectivity, of the AHM film. A carrier gas of substantially helium may also reduce sputtering of the AHM film.

In one aspect of the embodiments herein, a method of forming an ashable hard mask (AHM) film is provided, the method may include exposing a semiconductor substrate to a process gas may include a hydrocarbon precursor gas and helium gas, substantially without any other inert gas; and depositing on the substrate an AHM film by a plasma enhanced chemical vapor deposition (PECVD) process, wherein the process may include igniting a plasma generated by a dual radio frequency (RF) plasma source including a high frequency (HF) component and a low frequency (LF) component; the HF power is constant during deposition, and the LF power is pulsed, with at least about 3000 W per 300 mm wafer and a duty cycle between about 10% and about 75%.

In some embodiments, the hydrocarbon precursor gas may include compounds having a molecular weight of at most about 50 g/mol. In some implementations, the hydrocarbon precursor gas may include compounds having a C:H ratio of at least 0.5. In various implementations, the hydrocarbon precursor gas may include acetylene ($C_2H_2$). In some embodiments, the hydrocarbon precursor has a partial pressure between about 1-2% of the process gas.

In various embodiments, the LF power is provided at a frequency of less than or equal to about 2 MHz. In various embodiments, the LF power is between about 3500 W and about 6500 W per 300 mm wafer. In some implementations, the LF power is pulsed at a frequency of at least about 100 Hz. In some implementations, the LF power is pulsed at a frequency between about 100 Hz and about 1000 Hz.

In some embodiments, the LF power duty cycle is between about 10% and about 50%. In various embodiments, the LF power duty cycle is between about 60% and about 90%. In various implementations, the LF power has an on period for a duration of between about 200 microseconds and about 300 microseconds. In some embodiments, the method is performed in a multi-station reactor.

In various implementations, the internal stress of the AHM film is at most about −1400 MPa. In various embodiments, the modulus of the AHM film is at least about 80 GPa. In some embodiments, the density of the AHM film is at least about 1.5 g/cm$^3$.

In some implementations, the hydrogen concentration of the AHM film is at most about 25 atomic percent. In various embodiments, the thickness of the AHM film is at most about 2500 nm. In some embodiments, a gap between the pedestal and the showerhead is less than about 20 mm.

In some embodiments, the method may further include patterning the deposited AHM film and etching the patterned AHM film to define features of the AHM film in the substrate. In various embodiments, the method may further include etching layers in the substrate underlying the AHM film.

In another aspect of the embodiments herein, a method of forming an ashable hard mask (AHM) film is provided, the method including: exposing a semiconductor substrate to a process gas may include a hydrocarbon precursor gas and an inert gas; and depositing on the substrate an AHM film by a plasma enhanced chemical vapor deposition (PECVD) process, wherein the process may include: igniting a plasma generated by a dual radio frequency (RF) plasma source including a high frequency (HF) component and a low frequency (LF) component; the HF power is constant during deposition, and the LF power is pulsed, with at least about 3000 W per 300 mm wafer and the LF power on time per duty cycle is less than 300 microseconds.

In some implementations, the LF power duty cycle is between about 10% and 50%. In various embodiments, the LF power on time is between 200 microseconds and 300 microseconds. In some implementations, the LF power is pulsed at a frequency of at least 100 Hz.

These and other features will be described in more detail below with reference to the figures.

BRIEF DESCRIPTION OF DRAWINGS

FIG. 4A-C are illustrations of various properties that relate to pulsing low frequency (LF) power.

DETAILED DESCRIPTION

Introduction and Context

In semiconductor processing, masking methods are used to pattern and etch substrates. As substrate aspect ratios increase, the demand for highly selective hard masks increases. Masks that have high etch selectivity and yet are easy to remove without damage to the substrate are important to processing substrates. Ashable hard masks (AHMs) can be used as masks in etch stop layers or during selective etching, or where a photoresist may not be thick enough to mask the underlying layer. AHMs may also be used on glass substrates used for displays and other technologies.

AHM films have a chemical composition that allows them to be removed by a technique referred to as "ashing," "plasma ashing," or "dry stripping" once they have served their purpose. One example of an AHM film is an amorphous carbon layer or film. An AHM film is generally composed of carbon and hydrogen with, optionally, a trace amount of one or more dopants (e.g., nitrogen, fluorine, boron, and silicon). The bonding structure of an AHM can vary from $sp^2$ (graphite-like) or $sp^3$ (diamond-like), or a combination of both, depending on the deposition conditions.

Figure 1:
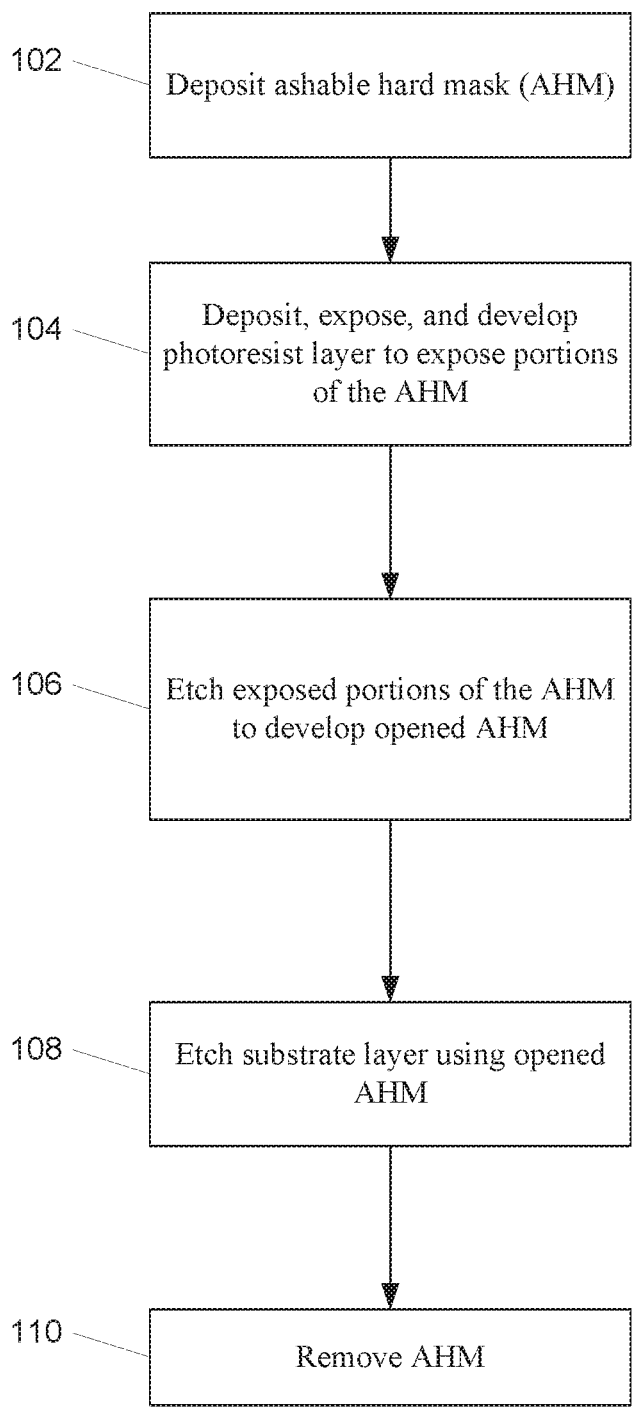
FIG. 1 is a process flow diagram showing relevant operations of methods of using ashable hard masks in etching operations according to various embodiments.

FIG. 1 is a process flow diagram showing relevant operations of methods of using an AHM as a hard mask in etching operations. While the description below refers chiefly to semiconductor substrates, the methods may also be applied to layers on other types of substrates including glass substrates. Examples of materials that may be masked with the AHM include dielectric materials such as oxides (e.g., $SiO_2$) and nitrides (e.g., SiN and TiN), polysilicon (Poly-Si), and metals such as aluminum (Al), copper (Cu), and tungsten (W). In certain embodiments, the AHMs described herein are used to pattern oxides, nitrides, or polysilicon layers.

In operation 102, an ashable hard mask is deposited on the layer to be etched by plasma enhanced chemical vapor deposition (PECVD). PECVD processes involve generating plasma in the deposition chamber. As described further below with reference to FIG. 2, a dual radio frequency (RF) plasma sources that include a high frequency (HF) power and a low frequency (LF) power may be used. In some processes, one or more AHM layers are deposited.

In operation 106, a photoresist layer is deposited, exposed, and developed in accordance with the desired etch pattern. In some implementations, an anti-reflective layer (ARL) may be deposited on the AHM film prior to photoresist deposition.

In operation 108, the AHM film is opened by etching the exposed portions of the AHM. Opening the AHM may be performed by a fluorine-rich dry etch.

Next, in operation 110, the substrate layer is selectively etched to transfer the pattern to the substrate layer. The selective etch may be performed such that the substrate layer is etch without substantially diminishing the AHM walls. Examples of etches can include radical and/or ionic-based etches. Examples of etch chemistries can include halogen-based etch chemistries such as fluorine-containing and chlorine-containing etch chemistries. For example, capacitively-coupled plasmas generated from fluorocarbon-containing process gases may be used to selectively etch oxide layers. Specific examples of process gases include $C_xF_y$-containing process gases, optionally with oxygen ($O_2$) and an inert gas, such as $C_4H_9/CH_2F_2/O_2/Ar$.

Lastly, in operation 112, a technique referred to as ashing, plasma ashing, or dry stripping is used to remove the AHM. Ashing may be performed by an oxygen-rich dry etch. Often, oxygen is introduced in a chamber under vacuum and RF power creates oxygen radicals in plasma to react with the AHM and oxidize it to water ($H_2O$), carbon monoxide (CO), and carbon dioxide ($CO_2$). Optionally, any remaining AHM residue may also be removed by wet or dry etching processes after ashing. The result is a patterned substrate layer.

High aspect ratio patterning uses AHMs having high etch selectivity. Etch selectivity can be determined by comparing the etch rate of the AHM layer to an underlying layer. The etch selectivity can sometimes be approximated by determining the hydrogen content, refractive index (RI), density, and modulus, or rigidity, of the AHM layer. Typically, lower hydrogen content, lower RI, higher density, and higher modulus, or a more rigid, AHM is able to withstand higher etch rates in an etch process involving more ion bombardment. Therefore, AHMs with lower hydrogen content, lower RE, higher density, and/or higher modulus have higher selectivity and lower etching rate and can be used more efficiently and effectively for processing high aspect ratio semiconductor processes. The desired etch selectivity of the AHM may depend on the etching process and the composition of the underlying layers, but the correlation between etch selectivity and the material properties above remains the same regardless of the etching process or composition of the underlying layers. The selectivity correlations as described here applies to all types of underlying layers, including polysilicon layers, oxide layers, and nitride layers.

Figure 2B:
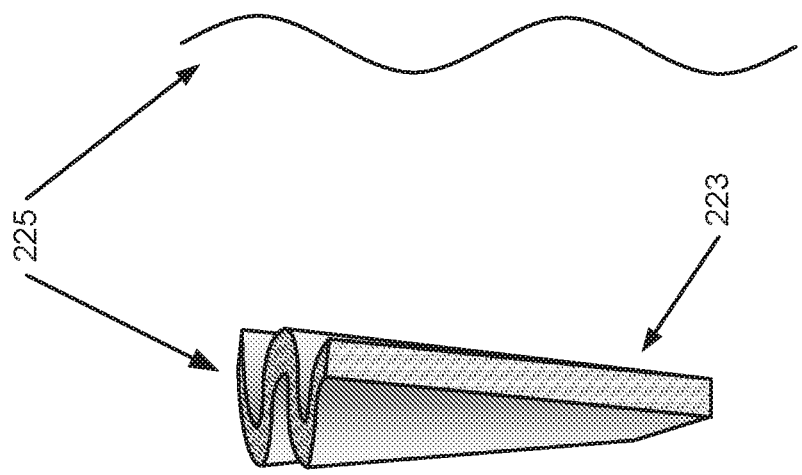
FIGS. 2A and 2B are illustrations of line-bending of a patterned ashable hard mask.
Figure 2A:
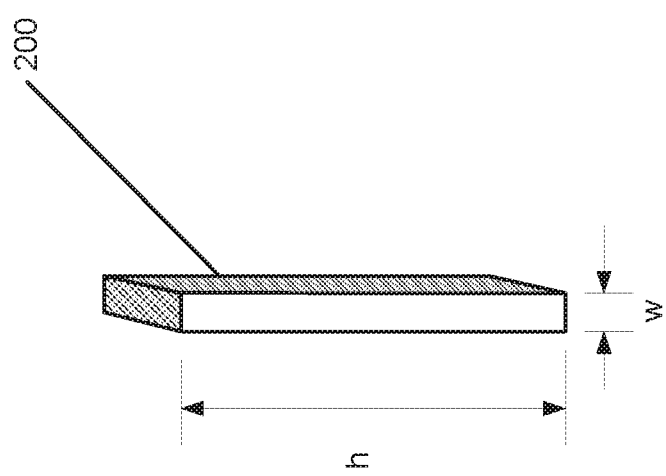

It has been observed that AHM films produced using continuous wave (CW) LF and HF plasma may have certain problems. For example, they may have relatively high internal stress, high hydrogen content, low density, and/or low hardness/modulus. The ever-shrinking feature size of next-generation memory and logic applications requires films that do not exhibit a significant amount of line-bending, or the distortion of features after the pattern has been etched into a stack of films. FIGS. 2A-B are illustrations of line-bending of a resist. FIG. 2A shows a feature 200 of a patterned AUM having a height, or thickness, 'h' and a line width 'w'. FIG. 2A has no line bending, which is the ideal condition for features of an AHM. FIG. 2B shows the same feature but with significant line-bending, which may have a vertical aspect 223 and a horizontal aspect 225. As illustrated, line-bending may be manifest as a curved, angled, or otherwise bent horizontal component. In some cases, line-bending is manifest as vertical component that deviates from perpendicular (normal) to a plane of substrate on which the line is formed. In the depicted embodiment, the line has a fan-like shape. Line-bending is undesirable for various reasons, among which are that it increases the line edge roughness (LER) and line width roughness (LWR) and reduces the critical dimension uniformity (CDU) of the AHM and underlying layers etched using the AHM. In general, line bending may cause distortion of features after the pattern has been etched into a stack of films.

Line-bending of an AHM can be roughly modeled by the following equation:

$$\text{Line bending propensity} \propto \frac{\sigma}{E}\left(\frac{h}{w}\right)^2$$

Where σ and E are the internal compressive stress and modulus of the AHM, respectively. This equation demonstrates that line-bending is directly related to stress and height, increasing with higher stress or height, (i.e. thickness), while inversely related to modulus and width, decreasing with increased modulus or width. As features size shrinks, the width of AHM features decrease to meet new critical dimension requirements. Furthermore, the required thickness of the AHM for an etch process is inversely proportional to its selectivity; higher selectivity allows for a thinner AHM, and lower selectivity requires a thicker AHM. Thus, line-bending may be reduced by reducing the stress, increasing the modulus, or reducing the thickness, but reducing the thickness requires increasing selectivity.

Highly selective AHM films typically have high stress levels. Some methods to form AHMs use continuous wave RF power plasma in a PECVD process. Using continuous wave RF power results in continuous ion bombardment, which increases film density, thereby increasing etch selectivity by creating more $sp^3$ bonds between carbon atoms. However, continuous ion bombardment may also incorporate excessive unbound hydrogen atoms in the film and modify the growing film by bombardment with heavy atomic weight ions. These effects may increase the stress of the deposited AHM film, which limits AHM applications because high stress AHMs are more likely to exhibit line-bending.

On the other hand, AHMs with low stress levels, and concomitant less line bending, have lower selectivity. Some methods to form AHMs pulse RF power plasma during a PECVD process. Pulsing the RF power results in pulsed ion bombardment, which decreases stress levels, thereby reducing line-bending. However, pulsed ion bombardment may also reduce the number of $sp^3$ bonds, which leads to lower density and lower selectivity. The lower selectivity requires a thicker AHM for the same etch process, which increases the amount of line-bending.

According to various embodiments, methods of forming AHM films produce films that have high selectivity and low stress. An AHM film deposition technique uses low frequency (LF) RF pulsing, with or without continuous wave (CW) high frequency (HF) RF, at high single station LF power to reduce the internal stress (make the stress more neutral), reduce the hydrogen content, and increase the selectivity of the diamond-like carbon (DLC) films usable as AHMs. These methods yield AHMs with improved selectivity at a given stress level, or a decreased stress level at a given selectivity, thus improving the AHM performance in semiconductor processing.

In various embodiments, an AHM deposition technique uses low frequency (LF) RF pulsing, with or without continuous wave (CW) high frequency (HF) RF, at high single station LF power to reduce the internal stress (make the stress more neutral), reduce the hydrogen content, and increase the selectivity of the diamond-like carbon (DLC) films when used as an ashable hard mask (AHM). There may be three main components to this process. First, high LF power may be used at each station. In various embodiments, the general range of the process is 3500 to 6500 W of LF power per station with a significant stress reduction and densification of the DLC film. Second, a carrier gas that contains substantially only helium is used. Argon is conventionally used to help contain plasma for the sake of uniformity. However, Argon ions may sputter the AHM at high ion energies, reducing the density and selectivity. Third, fast pulsing frequency and low duty cycle, resulting in a short LF "on time" allows the plasma to increase the peak ion energy while maintaining a low mean ion density. In other words, because of the fast LF pulsing, there are fewer ions with higher energy than continuous wave plasma. The benefits of high LF power may be most significant when pulsing is employed.

Certain embodiments use relatively fast (greater than 100 Hz at 25% duty cycle) LF pulsing, with or without CW HF, at high LF power per station in a He/hydrocarbon precursor only atmosphere.

Figure 3:
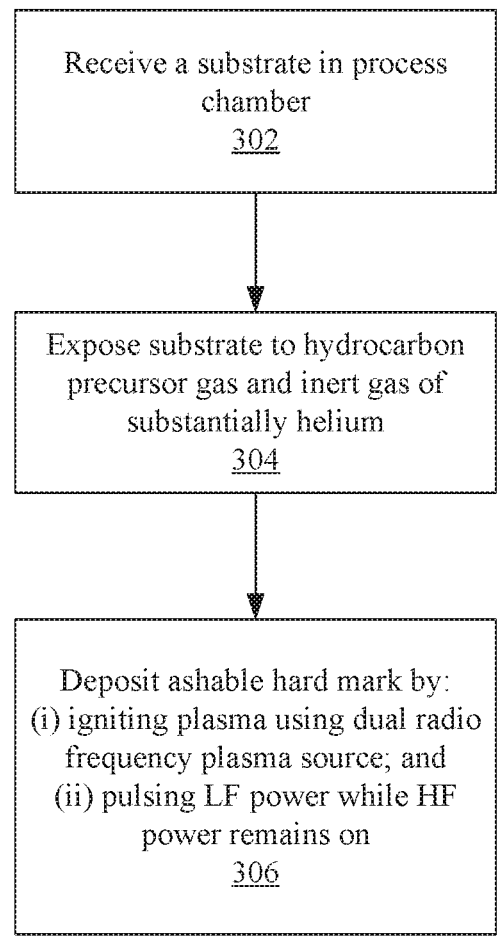
FIG. 3 is a process flow diagram showing relevant operations of methods of forming ashable hard masks by modulating dual radio frequency plasma generators according to various embodiments.

FIG. 3 shows a process flow diagram showing relevant operations of methods of forming AHMs by modulating dual RF plasma power according to various embodiments. In operation 302 a substrate is received in a process chamber. The substrate may be provided to the chamber in this operation, or the substrate may already be in the chamber from a prior operation. In operation 304 the substrate is exposed to a process gas including a hydrocarbon precursor. In addition to hydrocarbon precursors, an inert gas carrier may be used. The inert gas may include helium (He), argon (Ar), nitrogen ($N_2$), hydrogen ($H_2$), or a combination of any of these. In some embodiments the inert gas is substantially entirely helium.

Next, in operation 306, an ashable hard mask is deposited on the substrate by a PECVD process by igniting plasma using a dual RF plasma source to produce a plasma having a pulsed low frequency (LF) component and a high frequency (HF) component. The pulsed LF component may be produced by pulsing a LF power source. In some embodiments, pulsing the LF RF power includes using a high power, fast pulse, and low duty cycle to generate a high peak energy ion bombardment with a low mean ion density.

The result of operation 306 is an AHM film. This process produces a film with better density to stress ratio and higher selectivity. Depending on the duty cycle of the LF power, the pulsing frequency may be adjusted to maintain the high mean ion energy, while altering the mean ion density. In some embodiments the DC may be decreased to produce a low modulus, low stress, film. In other embodiments, DC may be increased to produce a high modulus, high stress, film. Increasing DC may also increase the deposition rate of the AHM film. Both types of films may be desirable depending on other process conditions.

Proposed Mechanism

FIGS. 4A-C demonstrate how LF power is pulsed, and how that may improve the deposition results of an AHM deposition. FIG. 4A shows pulsed LF power over time, and the associated duty cycle. At times 402 the LF power is on, or set at high power, while at times 404 the LF power is off, or set at low power. As illustrated and known in the art, a duty cycle is defined by the equation $DC=t_{on}/(t_{on}+t_{off})$, and represents the percentage of time that the power is on, or set at high power. Duty cycle and pulse frequency together can be used to determine the time that LF power is on, i.e. a 100 Hz pulse frequency with a duty cycle of 25% indicates that the LF power is on for 2.5 ms, and off for 7.5 ms.

FIG. 4B is an illustration of a surface of the substrate during deposition of an AHM when the LF power is on and off according to a possible mechanism for forming AHM films in accordance with this disclosure. State 410 illustrates the substrate surface when the LF power is on. LF power generally energizes the ion component of plasma, and when the LF power is on carbon ions 412 bombard the surface of the substrate. Ion bombardment may increase density, as discussed above, but the higher density of charged ions may also increase the stress of the AHM, which is undesirable, and may also form a charged surface 414. State 420 illustrates a possible condition of the substrate surface when the LF power is off. When the LF power is off, the ion bombardment stops or is substantially reduced, and the ions embedded into the substrate surface absorb electrons 422 to develop a neutral charge. While not wishing to be bound by theory, this allows the ions to form a more ordered structure 424, reducing the stress within the substrate surface, which is desirable. However, this reduction in stress may come at the expense of reduced density, and thus selectivity. By pulsing the LF power, the surface may alternate between states 410 and 420 to deposit an AHM having a reduced internal stress.

FIG. 4C is a graph of plasma temperature over time, where temperature is in electron volts. When LF power is pulsed, there is a brief high ion energy peak 442 upon ignition, followed by an energy shelf 444 where the temperature stabilizes, and finally a low temperature region 446 when the LF power is turned off. The energy peak 442 has a substantially static time duration, i.e. regardless of how fast the LF power is pulsed, the energy peak will last for substantially the same amount of time. The energy shelf 444, on the other hand, exists for more or less time depending on how long the LF power is on. Thus, at high pulse frequencies and low duty cycles, the LF power exhibits a higher mean ion energy while maintaining a low mean ion density. Within a certain range of energy, higher mean ion energy increases the modulus of the hardmask, which is desirable, while low mean ion density decreases stress, which is also desirable.

In some embodiments the duty cycle may be increased to increase the mean ion density, which may result in a denser, higher modulus AHM, at the expense of additional stress. AHM films deposited using a higher DC may still have a higher mean ion energy by using techniques disclosed herein, resulting in a film with better selectivity than other films with the same amount of internal stress.

The plasma also comprises the inert gas, which in some embodiments the inert gas is helium substantially without any other gas. Heavier inert gases, such as Argon, are commonly used to help contain plasma for the sake of uniformity, however, such ions may sputter the AHM at ion energies above 3000 W. This is obviously undesirable for a deposition process. Helium may be used without sputtering the AHM, at low ion energies, which is desirable and results in a more uniform deposition.

Process Window

This section describes various process parameters that may be employed to produce AHM films. The process parameters are provided for a plasma enhanced chemical vapor deposition process that takes place in a process chamber such as one described below.

In various embodiments, the total pressure in the process chamber is between about 0.5 Torr and about 20 Torr. In some embodiments, pressure is between about 5 Torr and about 10 Torr, or between about 0.5 Torr and about 1.5 Torr. In some embodiments, the hydrocarbon precursor is present in the process chamber at a relatively low partial pressure, e.g., between about 0.01 Torr and about 4 Torr, as discussed in U.S. Pat. Nos. 7,981,777 and 7,981,810, which are incorporated by reference herein in their entireties. In certain embodiments, the hydrocarbon precursor partial pressure is at or below about 0.2 Torr.

In some embodiments, the hydrocarbon precursor is one defined by the formula $C_xH_y$, wherein X is an integer between 2 and 10, and Y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). In certain embodiments the hydrocarbon precursor is a halogenated hydrocarbon, where one or more hydrogen atoms are replaced by a halogen, particularly fluorine, chlorine, bromine, and/or iodine. In some embodiments the hydrocarbon precursor comprises compounds having a molecular weight of at most about 50 g/mol. In some embodiments the hydrocarbon precursor has a ratio of C:H of at least 1:2. In some embodiments the hydrocarbon precursor is acetylene ($C_2H_2$). In some embodiments, two or more hydrocarbon precursors may be used.

In some embodiments the inert gas comprises at least about 50% or at least about 80% or at least about 95% helium by volume of all inert gas used. In some embodiments the inert gas is helium substantially without any other inert gas.

Precursor gas volumetric flow rates depend on the particular process chamber, substrate, and other process conditions. Examples of volumetric flow rates that may be used for a single 300 mm substrates are between about 10 sccm and about 1,000 sccm of acetylene and between about 250 sccm and about 5,000 sccm of helium. In some embodiments the flow rate of acetylene is between about 1% and about 3% of the total flow rate and helium comprises the rest of the total flow rate. In some embodiments the volumetric flow is between about 15 sccm and about 45 sccm $C_2H_2$, and between about 1455 sccm and about 1485 sccm helium. In some embodiments the volumetric flow is between about 18 sccm and about 20 sccm $C_2H_2$, and between about 1480 sccm and about 1482 sccm helium, all values per 300 mm substrate. In some embodiments the volumetric flow rate is between about 40 sccm and about 45 sccm $C_2H_2$, and between about 1455 sccm and about 1460 sccm helium. Unless otherwise specified, the flow rates disclosed herein are for a single station tool configured for 300 mm wafers. Flow rates generally scale linearly with the number of stations and substrate area.

The AHM film deposition methods described herein may be performed at any appropriate process temperature to obtain desired AHM characteristics, with examples ranging from about 50° C. to about 550° C. In some embodiments the process temperature is between about 100° C. and about 200° C. In some embodiments the process temperature is between about 150° C. and about 175° C. Process temperature can affect the stress, selectivity, and transparency at least in part due to $sp^2$ bond versus $sp^3$ bond formation. Higher temperatures favor $sp^2$ rich amorphous carbon network formation as the high temperatures enable easy breakage of C—H bonds and subsequent diffusion of hydrogen. For example, films deposited at temperatures above about 500° C. may have significantly more $sp^2$ CH and $CH_2$ bonds and relatively fewer $sp^3$ bonds, which have increased carbon content and higher density, and correlate with increased etch selectivity. However, these $sp^2$-rich films may not be suitable for thick hard mask applications. For example, at 2,000 Å and above, the films may not be transparent enough for mask alignment. 633 nm lasers may be used for transparent films and semi-transparent films but not for more opaque films such as produced at high temperatures. U.S. Pat. No. 7,981,810, previously incorporated herein by reference in its entirety, provides process conditions for deposition of selective and transparent AHM's at lower temperatures and/or with dilute hydrocarbon precursor flows. AHM films deposited at lower temperatures, e.g., below about 400° C. may have more less $sp^2$ bonding compared to films deposited at higher temperatures.

In some embodiments, low frequency (LF) RF power refers to an RF power having a frequency between about 100 kHz and about 2 MHz. In some embodiments, pulsing frequency may be limited by the operation capability of the LF generator. In some embodiments, LF RF power has an RF power with a frequency of about 400 kHz, for example 430 kHz. High frequency RF power refers to an RF power having a frequency between about 2 MHz and about 60 MHz. In some embodiments, HF RF power has an RF power with a frequency of about 13.56 MHz.

In some embodiments, HF and LF RF components can be pulsed in a synchronized manner. If an HF component is pulsed, it is pulsed from high to low power and not turned off to avoid plasma sheath collapse. In some embodiments, pulsing only LF RF power may be advantageous to form more stable plasma.

In some embodiments, the LF power is pulsed while HF power is constant. In various embodiments, the LF power is pulsed by switching the LF power on and off. In some embodiments, the LF 'on' power is at least 3000 W per 300 mm substrate. In some embodiments the LF on power is between about 3500 W and about 6500 W per 300 mm substrate. In some embodiments, the LF 'off' power is 0W. In various embodiments, the LF power is pulsed by switching the LF between non-zero power levels, such that the LF off power is between 0W and the LF on power. In some embodiments, the LF power is pulsed between about 1000 W and about 6000 W. In some embodiments, the HF power per substrate ranges is about 0W and about 150 W per 300 mm substrate. In some embodiments, the HF power per substrate ranges between about 0W and about 800 W. In many embodiments, the minimum power of the HF RF component and the minimum power of the LF RF component are sufficient to maintain a plasma. All powers provided herein are per 300 mm substrate. RF power as described herein generally scales linearly with number of stations and area of wafers. The power values may be represented on a per area basis, e.g., 2500 W may also be represented as 0.884 $W/cm^2$.

Duty cycle (DC) for LF pulsing may range from about 10% to about 90%. In some embodiments the DC is between about 10% and about 50%, between about 10% and about 30%, or between about 10% and about 20%. In some embodiments the DC is between about 60% and about 90%, between about 60% and about 90%, or between about 60% and about 75%. In various embodiments, the LF power is pulsed at a frequency of between about 100 Hz and about 1000 Hz. In some embodiments, the LF power is pulsed at a frequency of at least about 200 Hz, or at least about 300 Hz. In some embodiments the DC and pulse frequency are set so that the LF power on time duration is between about 200 μs and about 2500 μs and the LF power off time duration is between about 800 μs and about 7500 μs. In some embodiments the LF power has an on period for a duration between about 200 μs and about 300 μs.

In some embodiments the gap between the pedestal and the showerhead is less than about 0.75 inches (20 mm) or between about 0.25 inches (about 6 mm) and about 0.75 inches (about 20 mm). As the RF power of the plasma increases, the gap between the pedestal and the showerhead may be increased without reducing the quality of the deposited AHM.

In some processes herein the AHM film deposits at a rate of at least 700 Å/min. In some embodiments the AHM film deposits at a rate of between about 700 Å/min and about 900 Å/min. The deposition rate of the AHM film may depend on the DC, as a longer mean 'on' time for the LF power will increase the deposition rate.

In some embodiments, the process conditions for depositing an AHM film include pulsing the LF power with at least about 3000 W per 300 mm wafer, with a duty cycle between about 10% and about 75%, and an inert gas that is substantially helium. In some embodiments, the process conditions include pulsing the LF power with at least 6000 W per 300 mm wafer, with a duty cycle between 10% and 75%, and an inert gas that is substantially helium. In some embodiments, the process conditions include pulsing the LF power with at least about 3000 W per 300 mm wafer, with a duty cycle between 10% and 40%, and an inert gas that is substantially helium.

Film Properties

AHM films produced in accordance with the disclosed methods are typically composed primarily of carbon and hydrogen, but other elements may be present in the film. Generally, the lower the atomic percent of hydrogen in the mask, the higher the modulus and selectivity. In some embodiments other elements may be added to the gas mixture, for example, if a halogenated hydrocarbon is used, the halogen may comprise a percentage of the film composition. In some embodiments, the hydrogen concentration is at most about 25 percent atomic. In some embodiments, the hydrogen concentration is between about 24 and 25 percent atomic. In some embodiments the carbon concentration is at least about 70 percent atomic. In some embodiments the carbon concentration is between about 70 and 76 percent atomic. Examples of other elements that may be present in the AHM film include halogens, Nitrogen, sulfur, boron, oxygen, tungsten, titanium, and aluminum. Typically, such other elements are present in amounts not greater than about 10 percent atomic.

In some embodiments, an AHM film produced in accordance with the methods describe herein has an internal stress magnitude of at most about −1400 MPa, or between about −200 MPa and about −1400 MPa. (negative internal stress denotes a compressive stress, such that lower values have less internal stress) In some embodiments, the AHM film has an elastic modulus of at least about 80 GPa, or between about 145 GPa and 160 GPa. In some embodiments, the AHM film has a hardness of at least about 9 GPa, or between about 15 GPa and about 17 GPa. In some embodiments, the AHM film has a density of at least about 1.5 $g/cm^3$, or between about 1.8 $g/cm^3$ and about 1.9 $gm/cm^3$.

In some embodiments an AHM film produced in accordance with the methods described herein has an extinction coefficient at 633 nm of at most about 0.4. The extinction coefficient may correlate with the ability of light to move through the AHM film, or the transparency of the film. In some embodiments, AHM films are transparent or translucent. AHM films without sufficiently low values of extinction coefficient may require additional operations in a later etch process to etch the AHM film, which is undesirable.

In some embodiments the thickness of an AHM film deposited in accordance with methods disclosed herein is between about 100 nm and about 2500 nm. Generally, the desired thickness of an AHM film may vary depending on the thickness of the underlying layers to be etched and the etch selectivity of the AHM, with thicker underlying layers to be etched requiring a thicker AHM. As discussed above, AHM films are used to etch a variety of underlying materials, and may have a different etch selectivity for each material. Etch selectivity of an AHM can be represented as a ratio of the etch rate of a material and the etch rate of the AHM, and may vary for different materials and etch chemistries.

Applications

AHMs are typically used for creating features of semiconductor devices by etching one or more underlying layers of a substrate. Materials that may be etched using an AHM may include silicon (single crystal, polysilicon, or amorphous silicon), silicon oxide, silicon nitride, and tungsten. In some embodiments multiple layers are stacked and etched using a single AHM. Examples of such stacks include a layer of silicon and a layer of silicon oxide, and a layer of tungsten and a layer of silicon nitride. In some embodiments a stack includes repeating layers that are etched using a single AHM. Examples of such repeating layers include repeating layers of silicon oxide/polysilicon (OPOP). Front end of line and back end of line features may be etched using an AHM as disclosed herein. Memory or logic device features may be patterned. Examples of memory devices include: DRAM, NAND, and 3D NAND.

EXAMPLES

Figure 5:
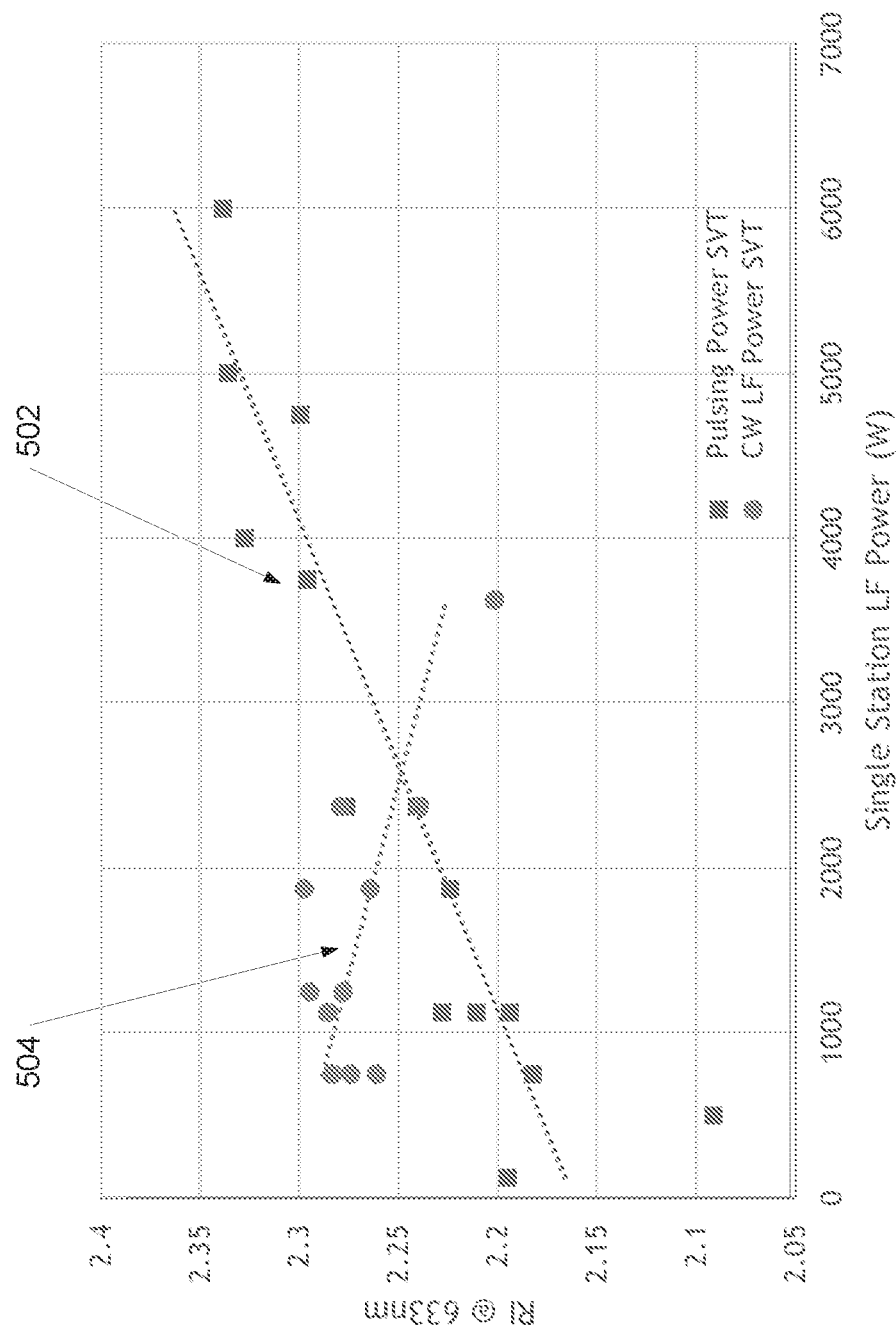
FIG. 5 shows a graph of refractive index of an ashable hard mask as a function of LF power for various embodiments.
Figure 6:
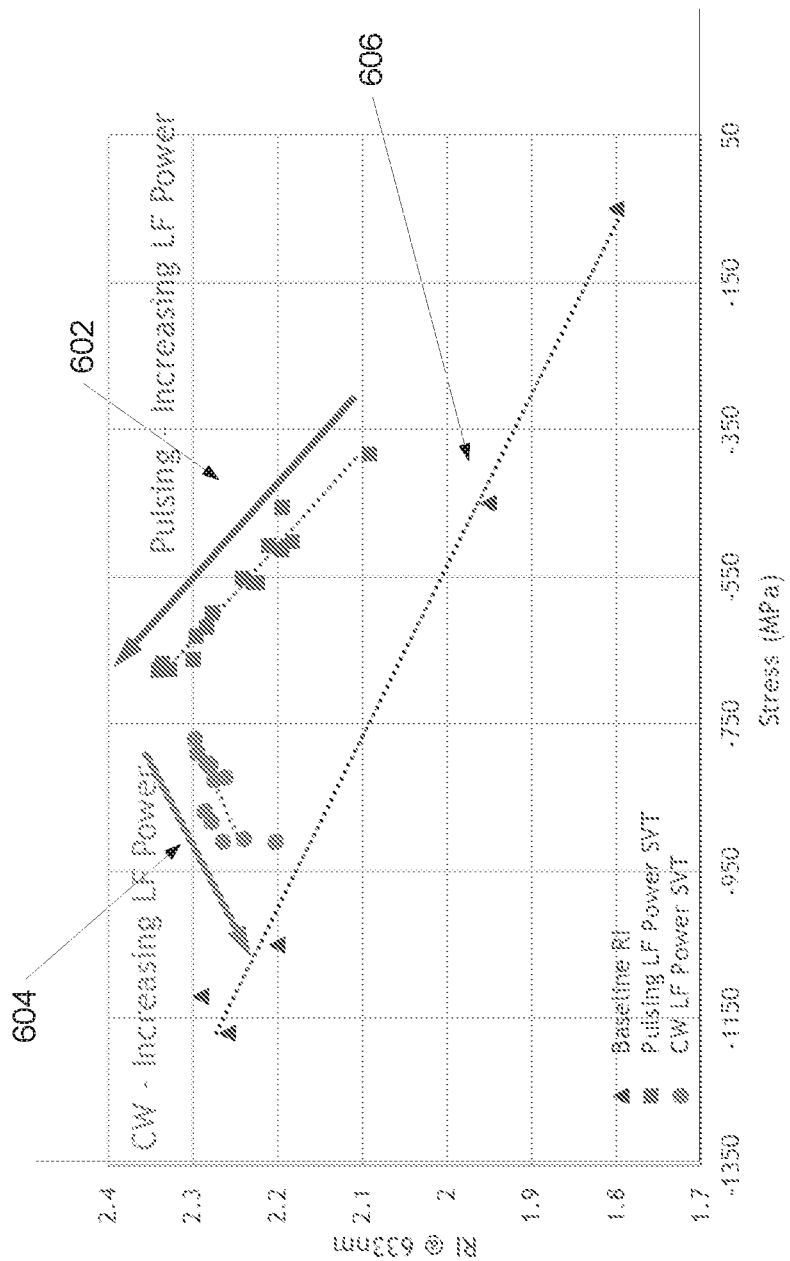
FIG. 6 shows a graph of refractive index of an ashable hard mask as a function of stress for various embodiments.

FIGS. 5 and 6 illustrate the effect of LF power when under pulsing or continuous wave conditions on refractive index of an AHM. Refractive index, or RI, can generally be used as a proxy for the selectivity of the material, with higher refractive index indicating higher selectivity of an AHM. Continuous wave power is where the LF power is held relatively constant during deposition.

FIG. 5 is a graph of refractive index as a function of LF power. Line 504 represents measurements from AHM deposited using a continuous wave (CW) LF power, while Line 502 represents measurements from AHM deposited by pulsing LF power as described herein. FIG. 5 illustrates that as power is increased, the refractive index, and thus selectivity, of an AHM deposited using a continuous wave technique decreases. In contrast, as the power of pulsed LF power increases, the refractive index, or selectivity, of an AHM increases. Thus, as LF power increases, a continuous wave technique will result in a lower selectivity AHM, while a pulse technique will result in a higher selectivity AHM.

FIG. 6 is a graph of refractive index as a function of internal stress, where negative stress is a compressive stress, and a more neutral stress is desirable. Line 606 is a line of refractive index as a function of stress for some AHM, illustrating that as refractive index, or selectivity, is increased, internal stress generally increases. Line 604 illustrates that, for continuous wave power, as LF power increases, the refractive index decreases, while the internal compressive stress increases. Both are undesirable, indicating that a lower LF power is desirable for a continuous wave technique. In contrast, line 602 illustrates that as LF power increases for pulsed LF power, the refractive index and the stress increase. Line 602, however, is steeper than line 606, indicating that as pulsed LF power is increased, the refractive index increases at a higher rate than the internal stress than line 606. Thus, while increasing LF power increases stress, the increase in stress is offset by a greater than normal increase in selectivity.

The table below presents a variety of film properties for two different films deposited according to some embodiments disclosed herein. The 3625 W process deposited an AHM film by pulsing LF power between 0W and 3625 W while exposing a substrate to a process gas of 44 sccm of $C_2H_2$ and 1466 sccm of helium. The 6000 W process deposited an AHM film by pulsing LF power between 0W and 6000 W while exposing a substrate to a process gas of 18 sccm of $C_2H_2$ and 1482 sccm of helium. Range % NU is a measurement of the non-uniformity of the deposition. H % is the percent of hydrogen in the AHM, as measured using hydrogen forward scattering. XRR density is the density as measured by x-ray reflectivity.

| Process | Dep Rate (Å/min) | RI @ 633 nm | Stress (MPa) | Range % NU | Hardness (MPa) | Modulus (MPa) | H % (HFS) | XRR Density (g/cm$^3$) |
|---|---|---|---|---|---|---|---|---|
| 3625 W | 872.2 | 2.307 | −632.0 | 3.6 | 15.6 | 145.3 | 25% | 1.88 |
| 6000 W | 764.0 | 2.334 | −695.8 | 3.3 | 16.5 | 152.0 | 24% | 1.90 |

Apparatus

Embodiments can be implemented in a plasma enhanced chemical vapor deposition (PECVD) reactor. Such a reactor may take many different forms. Various embodiments are compatible with existing semiconductor processing equipment—in particular, PECVD reactors such as Sequel™ or Vector™ reactor chambers available from Lam Research Corporation. The various embodiments may be implemented on a multi-station or single station tool. In specific embodiments, the 300 mm Lam Vector™ tool having a 4-station deposition scheme or the 200 mm Sequel™ tool having a 6-station deposition scheme are used.

Generally, the apparatus will include one or more chambers or reactors that each include one or more stations. Chambers will house one or more wafers and are suitable for wafer processing. The one or more chambers maintain the wafer in a defined position or positions, by preventing rotation, vibration, or other agitation. In some embodiment, a wafer undergoing AHM deposition is transferred from one station to another within a chamber during the process. For example, a 2000 Å AHM deposition may occur entirely at one station, or 500 Å of film may be deposited at each of four stations in accordance with various embodiments. Alternatively, any other fraction of the total film thickness may be deposited at any number of stations. In various embodiments where more than one AHM is deposited, more than one station may be used to deposit each AHM layer. During processing, each wafer is held in place by a pedestal, wafer chuck, and/or other wafer holding apparatus. For certain operations where the wafer is to be heated, the apparatus may include a heater such as a heating plate.

Figure 7:
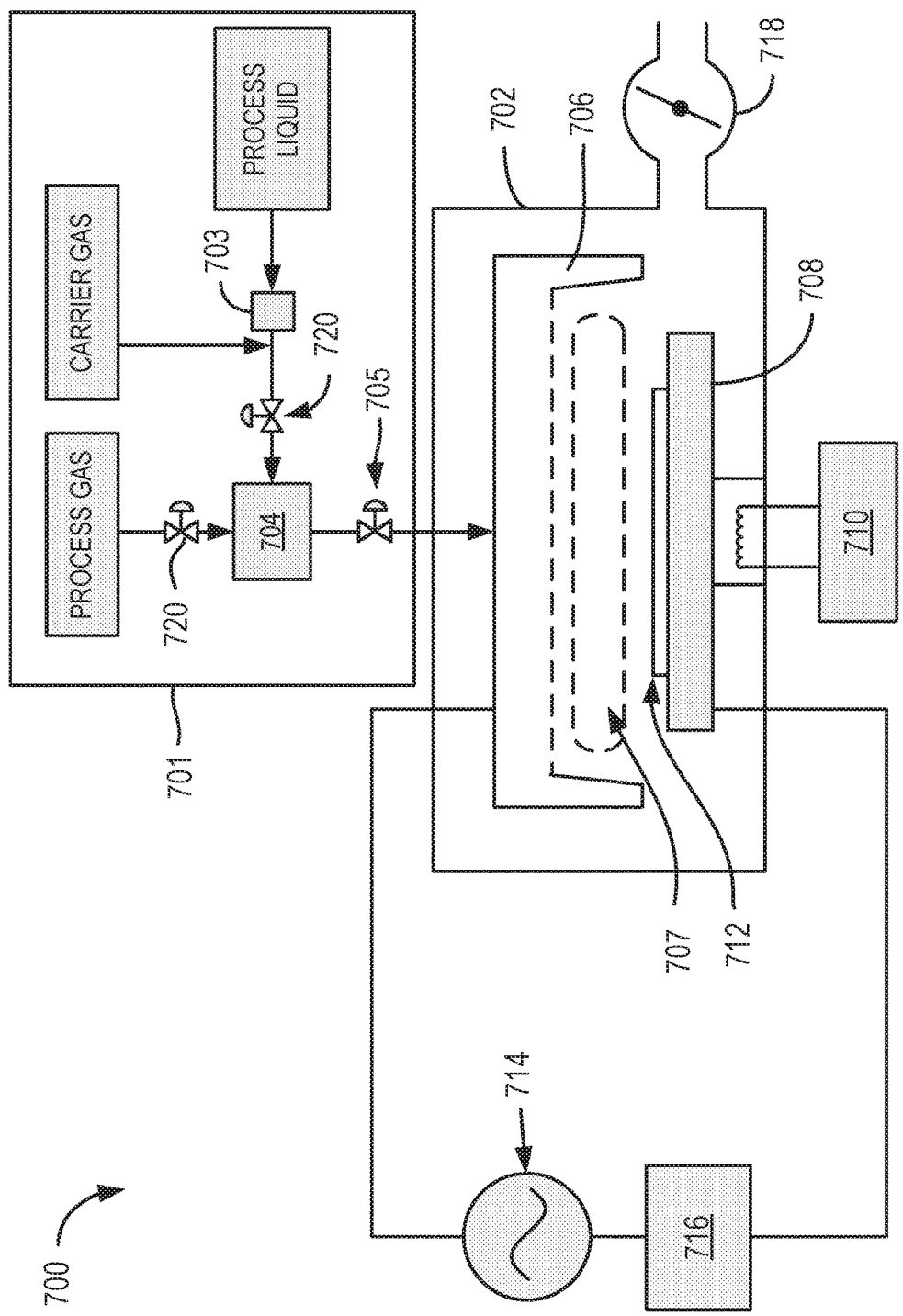
FIG. 7 shows a schematic illustration of a plasma enhanced chemical vapor deposition (PECVD) chamber suitable for practicing various embodiments.

FIG. 7 schematically shows an embodiment of a process station 700 that may be used to deposit material using plasma enhanced chemical vapor deposition (PECVD). For simplicity, the process station 700 is depicted as a standalone process station having a process chamber body 702 for maintaining a low-pressure environment. However, it will be appreciated that a plurality of process stations 700 may be included in a common process tool environment. Further, it will be appreciated that, in some embodiments, one or more hardware parameters of process station 700, including those discussed in detail below, may be adjusted programmatically by one or more computer controllers.

Process station 700 fluidly communicates with reactant delivery system 701 for delivering process gases to a distribution showerhead 706. Reactant delivery system 701 includes a mixing vessel 704 for blending and/or conditioning process gases for delivery to showerhead 706. One or more mixing vessel inlet valves 720 may control introduction of process gases to mixing vessel 704. Similarly, a showerhead inlet valve 705 may control introduction of process gasses to the showerhead 706.

For example, the embodiment of FIG. 7 includes a vaporization point 703 for vaporizing liquid reactant to be supplied to mixing vessel 704. In some embodiments, vaporization point 703 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller upstream of vaporization point 703 may be provided for controlling a mass flow of liquid for vaporization and delivery to process station 700. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 706 distributes process gases toward substrate 712. In the embodiment shown in FIG. 7, substrate 712 is located beneath showerhead 706, and is shown resting on a pedestal 708. It will be appreciated that showerhead 706 may have any suitable shape, and may have any suitable number and arrangement of ports for distributing processes gases to substrate 712.

In some embodiments, a microvolume 707 is located beneath showerhead 706. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 708 may be raised or lowered to expose substrate 712 to microvolume 707 and/or to vary a volume of microvolume 707. For example, in a substrate transfer phase, pedestal 708 may be lowered to allow substrate 712 to be loaded onto pedestal 708. During a deposition process phase, pedestal 708 may be raised to position substrate 712 within microvolume 707. In some embodiments, microvolume 707 may completely enclose substrate 712 as well as a portion of pedestal 708 to create a region of high flow impedance during a deposition process.

Optionally, pedestal 708 may be lowered and/or raised during portions the deposition process to modulate process pressure, reactant concentration, etc., within microvolume 707. In one scenario where process chamber body 702 remains at a base pressure during the deposition process, lowering pedestal 708 may allow microvolume 707 to be evacuated. Example ratios of microvolume to process chamber volume include, but are not limited to, volume ratios between 1:700 and 1:10. It will be appreciated that, in some embodiments, pedestal height may be adjusted programmatically by a suitable computer controller.

In another scenario, adjusting a height of pedestal 708 may allow a plasma density to be varied during plasma activation and/or treatment cycles included in the deposition process. At the conclusion of the deposition process phase, pedestal 708 may be lowered during another substrate transfer phase to allow removal of substrate 712 from pedestal 708.

While the example microvolume variations described herein refer to a height-adjustable pedestal, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers.

Returning to the embodiment shown in FIG. 7, showerhead 706 and pedestal 708 electrically communicate with RF power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are included above. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 50 kHz and 700 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a hydrocarbon precursor gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some embodiments, pedestal 708 may be temperature controlled via heater 710. Further, in some embodiments, pressure control for deposition process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to process station 700.

Figure 8:
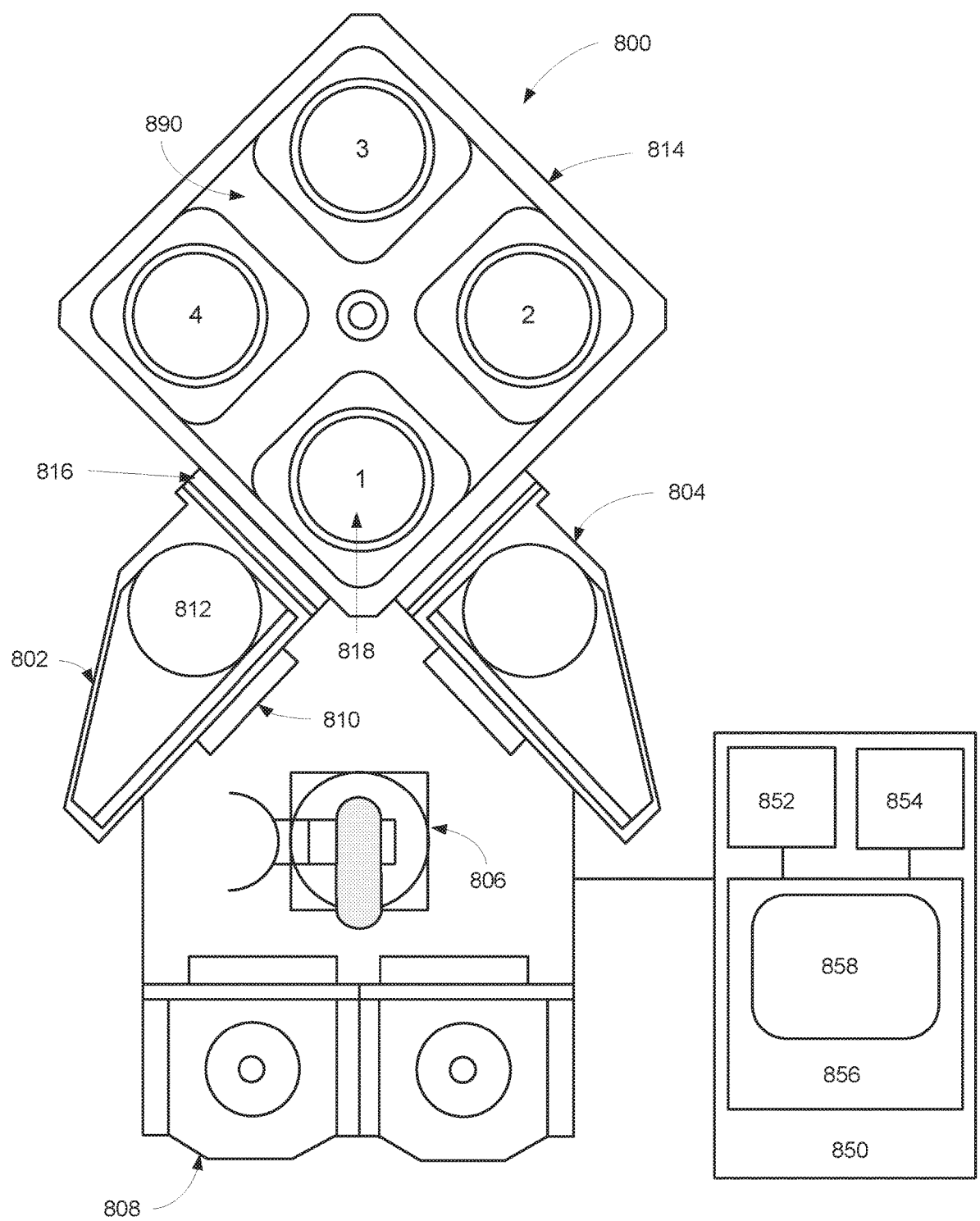
FIG. 8 shows another schematic illustration of another plasma enhanced chemical vapor deposition (PECVD) chamber suitable for practicing various embodiments.

FIG. 8 shows a schematic view of an embodiment of a multi-station processing tool 800 with an inbound load lock 802 and an outbound load lock 804, either or both of which may comprise a remote plasma source. A robot 806, at atmospheric pressure, is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 comprises a remote plasma source, the wafer may be exposed to a remote plasma treatment in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 814 comprises four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. While the depicted processing chamber 814 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 also depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. System control software 858 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 800. System control software 858 may be configured in any suitable way. For example, various process tool component subroutines or control objects may be written to control operation of the process tool components necessary to carry out various process tool processes in accordance with the disclosed methods. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 9:
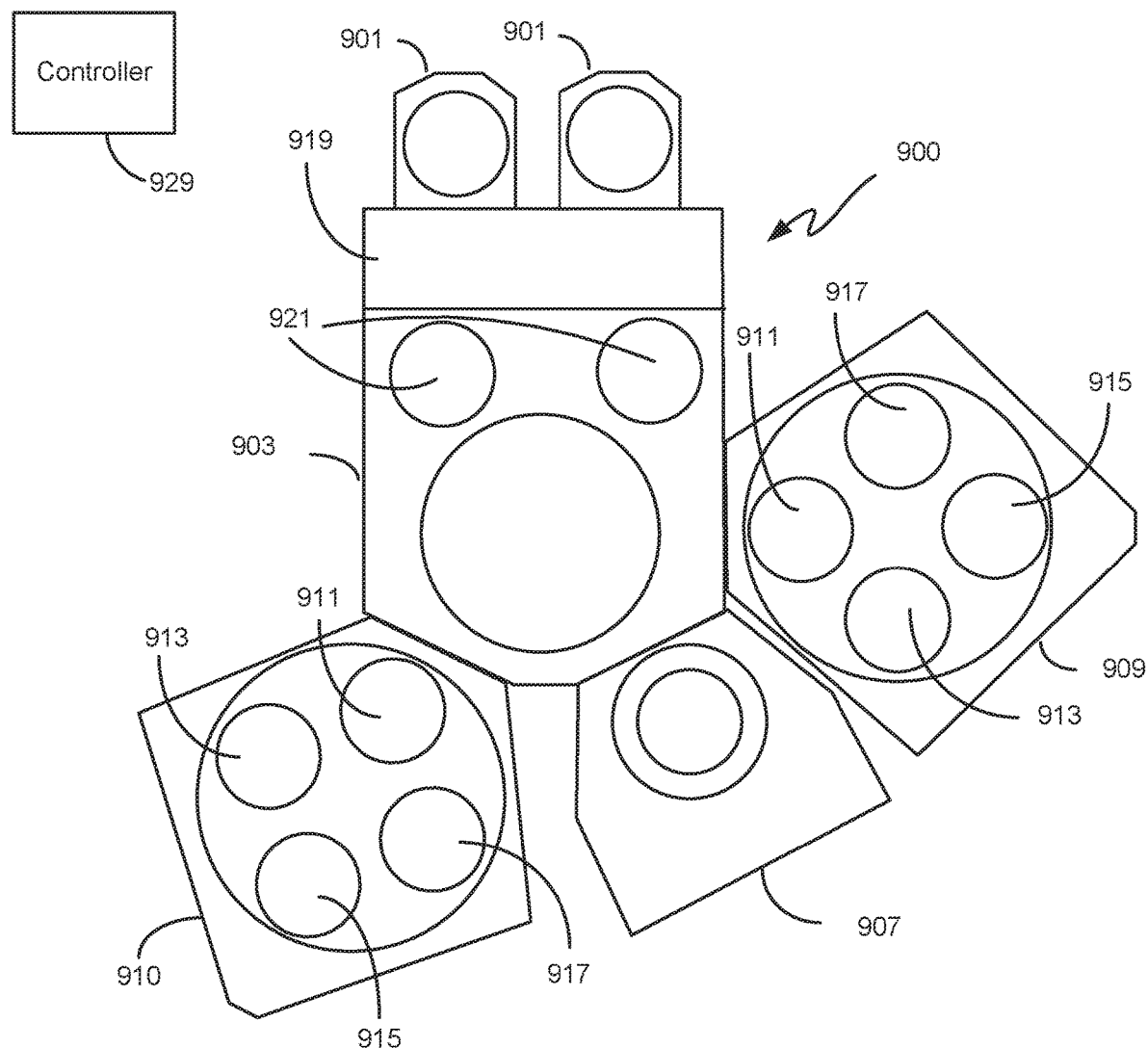
FIG. 9 shows a schematic illustration of a module cluster suitable for practicing various embodiments.

FIG. 9 is a block diagram of a processing system suitable for conducting thin film deposition processes in accordance with certain embodiments. The system 900 includes a transfer module 903. The transfer module 903 provides a clean, pressurized environment to minimize risk of contamination of substrates being processed as they are moved between various reactor modules. Mounted on the transfer module 903 are two multi-station reactors 909 and 910, each capable of performing atomic layer deposition (ALD) and/or chemical vapor deposition (CVD) according to certain embodiments. Reactors 909 and 910 may include multiple stations 911, 913, 915, and 917 that may sequentially or non-sequentially perform operations in accordance with disclosed embodiments. The stations may include a heated pedestal or substrate support, one or more gas inlets or showerhead or dispersion plate.

Also mounted on the transfer module 903 may be one or more single or multi-station modules 907 capable of performing plasma or chemical (non-plasma) pre-cleans, or any other processes described in relation to the disclosed methods. The module 907 may in some cases be used for various treatments to, for example, prepare a substrate for a deposition process. The module 907 may also be designed/configured to perform various other processes such as etching or polishing. The system 900 also includes one or more wafer source modules 901, where wafers are stored before and after processing. An atmospheric robot (not shown) in the atmospheric transfer chamber 919 may first remove wafers from the source modules 901 to loadlocks 921. A wafer transfer device (generally a robot arm unit) in the transfer module 903 moves the wafers from loadlocks 921 to and among the modules mounted on the transfer module 903.

In various embodiments, a system controller 929 is employed to control process conditions during deposition. The controller 929 will typically include one or more memory devices and one or more processors. A processor may include a CPU or computer, analog and/or digital input/output connections, stepper motor controller boards, etc.

The controller 929 may control all of the activities of the deposition apparatus. The system controller 929 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 929 may be employed in some embodiments.

Typically there will be a user interface associated with the controller 929. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 929. The signals for controlling the process are output on the analog and digital output connections of the deposition apparatus 900.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 929 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 929, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. In other instances, well-known process operations have not been described in detail to not unnecessarily obscure the disclosed embodiments. Accordingly, the present embodiments are to be considered as illustrative and not restrictive, and the embodiments are not to be limited to the details given herein.

What is claimed is:

1. A method of forming an ashable hardmask (AHM) film, comprising:
    exposing a semiconductor substrate to a process gas comprising a hydrocarbon precursor gas and helium gas, substantially without any other inert gas; and
    depositing on the substrate an AHM film by a plasma enhanced chemical vapor deposition (PECVD) process, wherein the process comprises:
        igniting a plasma generated by a dual radio frequency (RF) plasma source including a high frequency (HF) component and a low frequency (LF) component;
        a power of the HF component is constant during deposition, and
        a power of the LF component is pulsed, with at least about 3000 W per 300 mm wafer and a duty cycle between about 10% and about 75%.

2. The method of claim 1, wherein the hydrocarbon precursor gas comprises compounds having a molecular weight of at most about 50 g/mol.

3. The method of claim 1, wherein the hydrocarbon precursor gas comprises compounds having a C:H ratio of at least 0.5.

4. The method of claim 1, wherein the hydrocarbon precursor gas comprises acetylene ($C_2H_2$).

5. The method of claim 1, wherein the hydrocarbon precursor has a partial pressure between about 1-2% of the process gas.

6. The method of claim 1, wherein the LF power is provided at a frequency of less than or equal to about 2 MHz.

7. The method of claim 1, wherein the LF power is between about 3500 W and about 6500 W per 300 mm wafer.

8. The method of claim 1, wherein the LF power is pulsed at a frequency of at least about 100 Hz.

9. The method of claim 1, wherein the LF power is pulsed at a frequency between about 100 Hz and about 1000 Hz.

10. The method of claim 1, wherein the LF power duty cycle is between about 10% and about 50%.

11. The method of claim 1, wherein the LF power duty cycle is between about 60% and about 75%.

12. The method of claim 1, wherein the LF power has an on period for a duration of between about 200 microseconds and about 300 microseconds.

13. The method of claim 1, wherein the method is performed in a multi-station reactor.

14. The method of claim 1, wherein an internal stress of the AHM film is at most about −1400 MPa.

15. The method of claim 1, wherein a modulus of the AHM film is at least about 80 GPa.

16. The method of claim 1, wherein a density of the AHM film is at least about 1.5 $g/cm^3$.

17. The method of claim 1, wherein a hydrogen concentration of the AHM film is at most about 25 atomic percent.

18. The method of claim 1, wherein a thickness of the AHM film is at most about 2500 nm.

19. The method of claim 1, wherein the method is performed in a process chamber having a pedestal and a showerhead, and a gap between the pedestal and the showerhead is less than about 20 mm.

20. The method of claim 1, further comprising patterning the AHM film and etching the patterned AHM film to define features of the AHM film in the substrate.

21. The method of claim 20, further comprising etching layers of the substrate underlying the AHM film.

22. A method of forming an ashable hardmask (AHM) film, comprising:
    exposing a semiconductor substrate to a process gas comprising a hydrocarbon precursor gas and an inert gas; and
    depositing on the substrate an AHM film by a plasma enhanced chemical vapor deposition (PECVD) process, wherein the process comprises:
        igniting a plasma generated by a dual radio frequency (RF) plasma source including a high frequency (HF) component and a low frequency (LF) component;
        a power of the HF component is constant during deposition, and
        a power of the LF component is pulsed, with at least about 3000 W per 300 mm wafer and the LF power on time per duty cycle is less than about 300 microseconds.

23. The method of claim 22, wherein the LF power duty cycle is between about 10% and about 50%.

24. The method of claim 22, wherein the LF power on time is between about 200 microseconds and about 300 microseconds.

25. The method of claim 22, wherein the LF power is pulsed at a frequency of at least 100 Hz.

* * * * *